United States Patent
Lee et al.

(10) Patent No.: US 12,388,040 B2
(45) Date of Patent: Aug. 12, 2025

(54) SEMICONDUCTOR PACKAGE INCLUDING REDISTRIBUTION SUBSTRATE AND METHOD OF MANUFACTURING THE SAME

(71) Applicant: Samsung Electronics Co., Ltd., Suwon-si (KR)

(72) Inventors: Seokhyun Lee, Hwaseong-si (KR); Dongkyu Kim, Anyang-si (KR); Kyounglim Suk, Suwon-si (KR); Hyeonjeong Hwang, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 596 days.

(21) Appl. No.: 17/711,359

(22) Filed: Apr. 1, 2022

(65) Prior Publication Data

US 2022/0367403 A1   Nov. 17, 2022

(30) Foreign Application Priority Data

May 12, 2021  (KR) .................. 10-2021-0061469

(51) Int. Cl.
*H01L 23/00*   (2006.01)
*H01L 21/48*   (2006.01)
(Continued)

(52) U.S. Cl.
CPC .......... *H01L 24/20* (2013.01); *H01L 21/4853* (2013.01); *H01L 21/4857* (2013.01);
(Continued)

(58) Field of Classification Search
CPC . H01L 24/20; H01L 21/4853; H01L 21/4857; H01L 21/563; H01L 21/565;
(Continued)

(56) References Cited

U.S. PATENT DOCUMENTS 6,998,335 B2   2/2006  Fan et al.
7,064,436 B2   6/2006  Ishiguri et al.
(Continued)

FOREIGN PATENT DOCUMENTS

KR   10-2020-0047849 A   5/2020

OTHER PUBLICATIONS

Korean Office Action dated May 9, 2025 for corresponding Korean Application No. 10-2021-0061469.

*Primary Examiner* — Cuong B Nguyen
(74) *Attorney, Agent, or Firm* — Harness, Dickey & Pierce, P.L.C.

(57) ABSTRACT

A semiconductor package includes a redistribution substrate including a conductive structure having a lower conductive pattern and a redistribution structure electrically connected to the lower conductive pattern, on the lower conductive pattern, an insulating structure covering at least a side surface of the redistribution structure, and a protective layer between the lower conductive pattern and the insulating structure, a semiconductor chip on the redistribution substrate, and a lower connection pattern below the redistribution substrate and electrically connected to the lower conductive pattern. The protective layer includes a first portion in contact with at least a portion of an upper surface of the lower conductive pattern, and a second portion in contact with at least a portion of a side surface of the lower conductive pattern.

19 Claims, 21 Drawing Sheets

(51) Int. Cl.
*H01L 21/56* (2006.01)
*H01L 23/31* (2006.01)
*H01L 23/367* (2006.01)
*H01L 23/538* (2006.01)
*H01L 25/10* (2006.01)

(52) U.S. Cl.
CPC .......... *H01L 21/563* (2013.01); *H01L 21/565* (2013.01); *H01L 23/3128* (2013.01); *H01L 23/3135* (2013.01); *H01L 23/3675* (2013.01); *H01L 23/5383* (2013.01); *H01L 23/5386* (2013.01); *H01L 23/5389* (2013.01); *H01L 24/19* (2013.01); *H01L 25/105* (2013.01); H01L 2224/214 (2013.01); H01L 2225/1035 (2013.01); H01L 2225/1041 (2013.01)

(58) Field of Classification Search
CPC ............. H01L 23/3128; H01L 23/3135; H01L 23/3675; H01L 23/5383; H01L 23/5386; H01L 23/5389; H01L 24/19; H01L 25/105; H01L 2224/214; H01L 2225/1035; H01L 2225/1041; H01L 24/13; H01L 24/16; H01L 24/32; H01L 24/73; H01L 24/81; H01L 24/92; H01L 2221/68345; H01L 2221/68359; H01L 2224/0401; H01L 2224/05599; H01L 2224/13111; H01L 2224/13139; H01L 2224/13147; H01L 2224/16227; H01L 2224/16238; H01L 2224/32225; H01L 2224/73204; H01L 2224/81444; H01L 2224/81447; H01L 2224/81455; H01L 2224/8349; H01L 2224/92125; H01L 2225/1023; H01L 2225/1058; H01L 2924/15192; H01L 2924/15311; H01L 2924/15313; H01L 2924/1533; H01L 2924/16251; H01L 2924/18161; H01L 21/6835; H01L 25/0655; H01L 25/50; H01L 23/5385; H01L 23/49816; H01L 23/5226; H01L 23/525; H01L 24/02; H01L 2224/023; H01L 2224/73153

See application file for complete search history.

(56) References Cited

U.S. PATENT DOCUMENTS

| | | |
|---|---|---|
| 8,659,155 B2 | 2/2014 | Cheng et al. |
| 9,087,885 B2 | 7/2015 | Ji et al. |
| 10,276,402 B2 | 4/2019 | Chen et al. |
| 10,892,216 B2 | 1/2021 | Furuichi |
| 2014/0131856 A1 | 5/2014 | Do et al. |
| 2018/0277394 A1* | 9/2018 | Huemoeller ........ H01L 23/5389 |
| 2019/0115294 A1* | 4/2019 | Lu ..................... H01L 24/16 |
| 2019/0131225 A1* | 5/2019 | Jeong ................. H01L 21/4853 |
| 2020/0273817 A1 | 8/2020 | Choi et al. |

* cited by examiner

SEMICONDUCTOR PACKAGE INCLUDING REDISTRIBUTION SUBSTRATE AND METHOD OF MANUFACTURING THE SAME

CROSS-REFERENCE TO RELATED APPLICATION(S)

This application claims the benefit under 35 USC 119(a) of Korean Patent Application No. 10-2021-0061469 filed on May 12, 2021 in the Korean Intellectual Property Office, the entire disclosure of which is incorporated herein by reference for all purposes.

BACKGROUND

The present inventive concepts relate to semiconductor packages including a redistribution substrate, and methods of manufacturing the same.

In general, semiconductor packages may be comprised of printed circuit boards and semiconductor chips mounted on the printed circuit boards. This type of semiconductor package structure may have difficulty in reliably packaging semiconductor chips that require multifunctionality and high performance.

SUMMARY

Example embodiments provide a semiconductor package having reliability.

Example embodiments provide a method of manufacturing a semiconductor package.

According to example embodiments, a semiconductor package may include a redistribution substrate including a conductive structure having a lower conductive pattern and a redistribution structure electrically connected to the lower conductive pattern, the redistribution structure being on the lower conductive pattern. The redistribution substrate may include an insulating structure covering at least a side surface of the redistribution structure, and a protective layer between the lower conductive pattern and the insulating structure. The semiconductor package may include a semiconductor chip on the redistribution substrate; and a lower connection pattern below the redistribution substrate and electrically connected to the lower conductive pattern. The protective layer may include a first portion in contact with at least a portion of an upper surface of the lower conductive pattern, and a second portion in contact with at least a portion of a side surface of the lower conductive pattern.

According to example embodiments, a semiconductor package may include a redistribution substrate having a first surface and a second surface that are opposite surfaces in relation to each other; a semiconductor chip on the first surface of the redistribution substrate; a lower connection pattern below the second surface of the redistribution substrate; and an upper connection pattern electrically connecting the redistribution substrate and the semiconductor chip, the upper connection pattern being between the redistribution substrate and the semiconductor chip. The redistribution substrate may include a conductive structure, and an insulating structure covering at least a side surface of the conductive structure. The conductive structure may include a lower conductive pattern and a redistribution structure. The lower conductive pattern may be electrically connected to the lower connection pattern. The redistribution structure may include a plurality of redistribution patterns located on different levels on the lower conductive pattern. The redistribution substrate may further include a protective layer between the lower conductive pattern and the insulating structure. A lower redistribution pattern among the plurality of redistribution patterns may include a redistribution line, and a redistribution via extending downwardly from a portion of the redistribution line. The redistribution via may penetrate through the protective layer and contact the lower conductive pattern.

According to example embodiments, a semiconductor package may include a redistribution substrate including a conductive structure having a lower conductive pattern and a redistribution structure electrically connected to the lower conductive pattern and on the lower conductive pattern, an insulating structure covering at least a side surface of the redistribution structure, and a protective layer between the lower conductive pattern and the insulating structure. The semiconductor package may include a semiconductor chip on the redistribution substrate; and a lower connection pattern in contact with the lower conductive pattern and the protective layer, below the redistribution substrate. A thickness of the lower conductive pattern may range from about 3 μm to about 15 μm, a width of the lower conductive pattern may range from about 80 μm to about 300 μm, and a thickness of the protective layer may range from about 30 nm to about 300 nm.

According to example embodiments, a method of manufacturing a semiconductor package may include forming a lower conductive pattern on a carrier; forming a protective layer on the carrier, the protective layer including a first portion covering an upper surface of the lower conductive pattern, a second portion covering a side surface of the lower conductive pattern, and a third portion covering a surface of the carrier; forming a structure including an insulating structure and a redistribution structure, on the protective layer; mounting a semiconductor chip on the structure; removing the carrier to expose at least the third portion of the protective layer; and removing the third portion of the protective layer exposed in the removing of the carrier.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
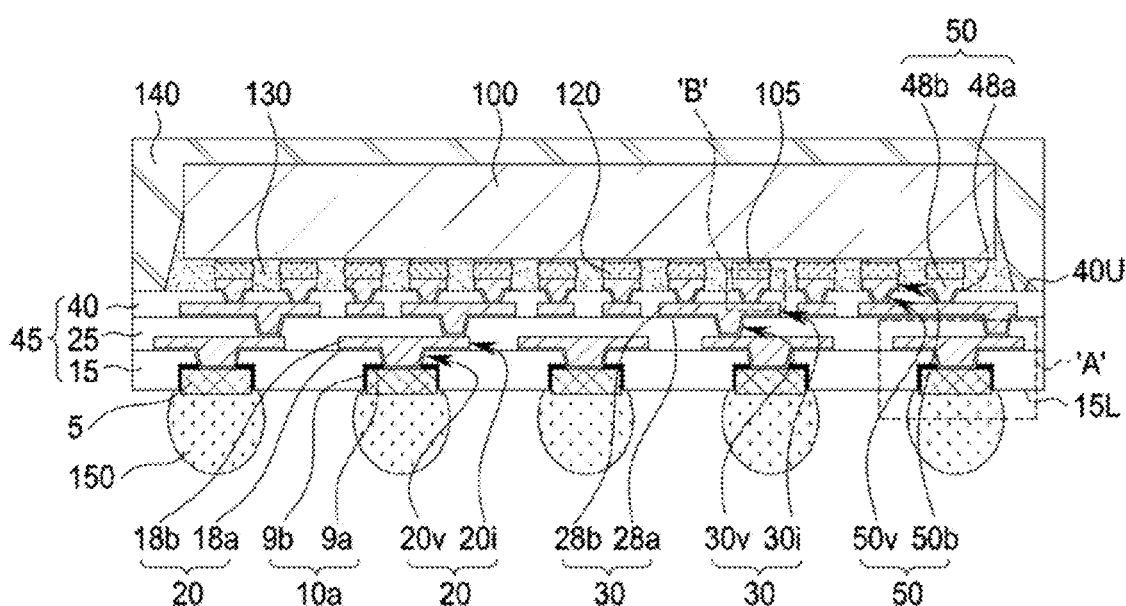
FIG. 1 is a cross-sectional view illustrating a semiconductor package according to example embodiments.
Figure 1:
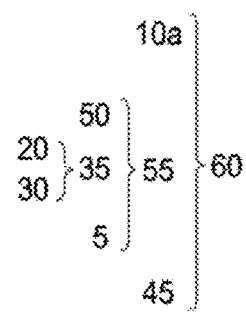

Hereinafter, example embodiments will be described with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," "flat," or the like with regard to other elements and/or properties thereof (e.g., structures, surfaces, directions, or the like) may be "perpendicular," "parallel," "coplanar," "flat" or the like or may be "substantially perpendicular," "substantially parallel," "substantially coplanar," "substantially flat," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

Elements and/or properties thereof (e.g., structures, surfaces, directions, or the like) that are "substantially flat" will be understood to be "flat" thereof within manufacturing tolerances and/or material tolerances and/or have a deviation in magnitude and/or angle from "flat" that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2A:
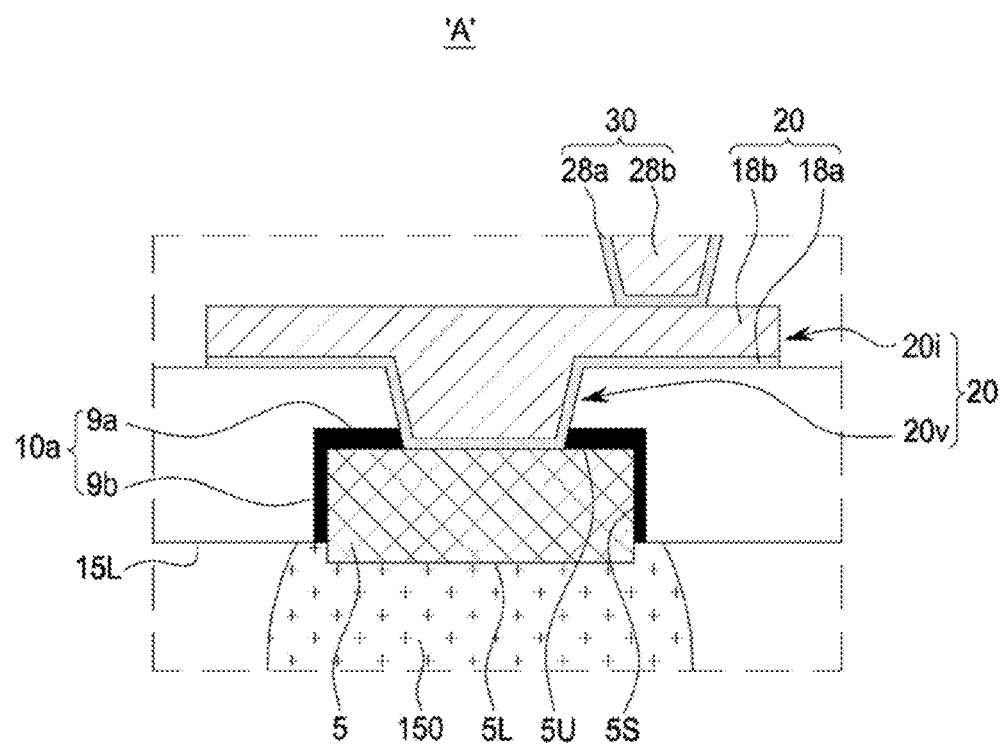
FIG. 2A is a partially enlarged view illustrating an illustrative example of a portion indicated by 'A' in FIG. 1.
Figure 2B:
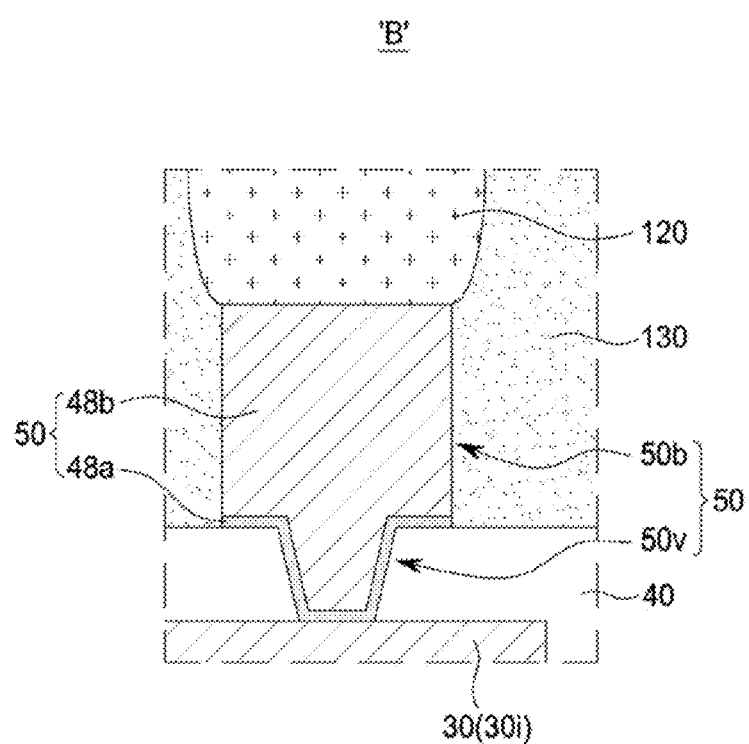
FIG. 2B is a partially enlarged view illustrating an illustrative example of a portion indicated by 'B' in FIG. 1.

First, a semiconductor package 1 according to example embodiments will be described with reference to FIGS. 1, 2A and 2B. FIG. 1 is a cross-sectional view illustrating the semiconductor package 1 according to example embodiments, and FIG. 2A is a partially enlarged cross-sectional view illustrating an illustrative example of a region indicated by 'A' in FIG. 1. FIG. 2B is a partially enlarged cross-sectional view illustrating an illustrative example of a region indicated by 'B' in FIG. 1.

Referring to FIGS. 1, 2A, and 2B, the semiconductor package 1 according to example embodiments may include a redistribution substrate 60 and a semiconductor chip 100 on the redistribution substrate 60.

The redistribution substrate 60 may include a conductive structure 55, a protective layer 10a, and an insulating structure 45. The insulating structure 45 may cover at least a side surface of the conductive structure 55. The semiconductor chip 100 may be provided in singular or plural. The semiconductor chip 100 may include at least one of a logic chip and a memory chip. For example, the semiconductor chip 100 may include a logic chip, for example, a microprocessor such as a central processor unit (CPU), a graphic processor unit (GPU), an application processor (AP) or the like, a field programmable gate array (FPGA), an application-specific IC (ASIC) or the like, or a memory chip. The memory chip may be a volatile memory chip or a non-volatile memory chip. For example, the volatile memory chip may include a dynamic random access memory (DRAM), static RAM (SRAM), thyristor RAM (TRAM), zero capacitor RAM (ZRAM), or twin transistor RAM (TTRAM). In addition, the non-volatile memory chip may include, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano floating gate memory, a holographic memory, a molecular electronics memory, or an insulator resistance change memory.

The insulating structure 45 may include a first insulating layer 15, a second insulating layer 25 on the first insulating layer 15, and a third insulating layer 40 on the second insulating layer 25. Although the insulating structure 45 is illustrated as including three insulating layers 15, 25 and 40, the example embodiments are not limited thereto, and the insulating structure 45 may be comprised of two, four or more insulating layers.

The insulating structure 45 may include a polymer material. At least one of the first to third insulating layers 15, 25, and 40 may be formed of a polymer material. For example, at least one of the first to third insulating layers 15, 25, and 40 may include a photosensitive polyimide material or a photosensitive polybenzoxazole (PBO).

The conductive structure 55 may include a lower conductive pattern 5 and a redistribution structure 35 disposed on the lower conductive pattern 5. The redistribution structure 35 may be electrically connected to the lower conductive pattern 5. The conductive structure 55 may further include an upper conductive pattern 50 on the redistribution structure 35. The lower conductive pattern 5 may be plural. The upper conductive pattern 50 may be plural.

The semiconductor package 1 may further include a lower connection pattern 150 below the redistribution substrate 60.

The lower conductive pattern 5 may include a lower surface 5L, an upper surface 5U, and a side surface 5S. The first insulating layer 15 may surround the side surface 5S of the lower conductive pattern 5 and may cover at least a portion of the upper surface 5U of the lower conductive pattern 5. A lower surface of the insulating structure 45, for example, a lower surface 15L of the first insulating layer 15 may be located on a different level from the lower surface 5L of the lower conductive pattern 5. For example, the lower surface 15L of the first insulating layer 15 may be located on a higher level than the lower surface 5L of the lower conductive pattern 5. The lower conductive pattern 5 may be electrically connected to the lower connection pattern 150.

Throughout the specification, the term "level" may be a term used to compare relative positions when viewed with reference to the accompanying drawings of cross-sectional structures. Therefore, in the following, even if there is no separate explanation or definition for the term "level," it can be understood based on the accompanying drawings of the cross-sectional structure.

In some example embodiments, the term "level" or "height level" of a surface, end, structure, or the like may refer to a distance of the surface, end, structure, or the like from a particular reference location in a particular direction (e.g., a distance from a lower surface 15L of the first insulating layer 15, a bottom of the lower connection pattern 150, or the like in the first direction that is perpendicular to the upper surface 5U of the lower conductive pattern 5). Therefore, when a first element is described herein to be at a higher level than a second element, the first element may be further from the common reference location (e.g., a lower surface 15L of the first insulating layer 15, a bottom of the lower connection pattern 150, or the like) than the second element in the particular direction (e.g., the first direction). Furthermore, when a first element is described herein to be at a lower level than a second element, the first element may be closer to the common reference location (e.g., a lower surface 15L of the first insulating layer 15, a bottom of the lower connection pattern 150, or the like) than the second element in the particular direction (e.g., the first direction). Furthermore, when a first element is described herein to be at a same level as a second element, the first element may be equally distant from/close to the common reference location (e.g., a lower surface 15L of the first insulating layer 15, a bottom of the lower connection pattern 150, or the like) as the second element in the particular direction (e.g., the first direction).

The lower conductive pattern 5 may include a copper material. For example, the lower conductive pattern 5 may be formed of a copper layer.

The thickness of the lower conductive pattern 5 (e.g., in the first direction perpendicular to the upper surface 5U of the lower conductive pattern 5) may be in the range of about 3 μm to about 15 μm.

The width or diameter of the lower conductive pattern 5 (e.g., in the second direction perpendicular to the side surface 5S of the lower conductive pattern 5) may be in the range of about 80 μm to about 300 μm.

The protective layer 10a may be disposed between the lower conductive pattern 5 and the insulating structure 45. The protective layer 10a may serve as an adhesive for bonding the lower conductive pattern 5 and the insulating structure 45. Accordingly, the protective layer 10a may be referred to as an 'adhesive layer'.

The protective layer 10a may serve to protect the lower conductive pattern 5 by preventing the lower conductive pattern 5 from being peeled off. Accordingly, since the protective layer 10a may prevent a defect from occurring when the lower conductive pattern 5 is peeled off, the reliability of the semiconductor package 1 may be improved.

The protective layer 10a may be formed of (e.g., may at least partially or completely comprise) a conductive material. For example, the protective layer 10a may include a Ti material, a Ti/W material, or a Ti/W/Cu material. The material of the protective layer 10a is not limited to the above-described type, and may be substituted with other materials.

The thickness of the protective layer 10a (e.g., in the first direction perpendicular to the upper surface 5U of the lower conductive pattern 5) may be in the range of about 30 nm to about 300 nm.

The protective layer 10a may include a first portion 9a in contact with at least a portion of the upper surface 5U of the lower conductive pattern 5, and a second portion 9b in contact with at least a portion of a side surface 5S of the lower conductive pattern 5.

In the protective layer 10a, the thickness of the first portion 9a in a first direction may be different from the thickness of the second portion 9b in a second direction. A thickness of the first portion 9a in the first direction may be greater than the thickness of the second portion 9b in the second direction. The first direction may be a direction, perpendicular to an upper surface 5U of the lower conductive pattern 5, and the second direction may be a direction, perpendicular to the side surface 5S of the lower conductive pattern 5. The first direction may be parallel to the side surface 5S of the lower conductive pattern 5, and the second direction may be parallel to the upper surface 5U of the lower conductive pattern 5.

The first portion 9a of the protective layer 10a may be disposed between the upper surface 5U of the lower conductive pattern 5 and the first insulating layer 15, and the second portion 9b of the protective layer 10a may be disposed between the side surface 5S of the lower conductive pattern 5 and the first insulating layer 15.

A lower end of the protective layer 10a may be located on (e.g., at) a level different from that of the lower surface 5L of the lower conductive pattern 5. For example, a lower end of the protective layer 10a may be located on (e.g., at) a higher level than the lower surface 5L of the lower conductive pattern 5.

The redistribution structure 35 may include a plurality of redistribution patterns 20 and 30 located on different height levels (e.g., located at different levels) on the lower conductive pattern 5. For example, the plurality of redistribution patterns 20 and 30 may include a lower redistribution pattern 20 and an upper redistribution pattern 30. In FIG. 1, the plurality of redistribution patterns 20 and 30 illustrate two redistribution patterns located on different levels, but the example embodiments of the present inventive concepts are not limited thereto. For example, the plurality of redistribution patterns may include three or more redistribution patterns disposed on different levels. For example, one or a plurality of redistribution patterns having a structure similar to that of the upper redistribution pattern may be disposed between the lower redistribution pattern 20 and the upper redistribution pattern 30.

The lower redistribution pattern 20 may include a redistribution via 20v penetrating through the first insulating layer 15, and a redistribution line 20i extending from the redistribution via 20v and disposed on the first insulating layer 15. The redistribution via 20v may extend downwardly (e.g., downwardly in the first direction) from a portion of the redistribution line 20i, penetrate through the protective layer 10a, and contact the lower conductive pattern 5 (e.g., contact the upper surface 5U). In the lower redistribution pattern 20, the redistribution via 20v may sequentially penetrate through the first insulating layer 15 and the protective layer 10a and may contact the lower conductive pattern 5. The redistribution via 20v may have a width (e.g., in the second direction which may be perpendicular to the side surface 5S and/or parallel to the upper surface 5U) less than a width of the lower conductive pattern 5.

In the lower redistribution pattern 20, the redistribution via 20v penetrates through the protective layer 10a and contacts the lower conductive pattern 5, thereby improving resistance characteristics.

The lower redistribution pattern 20 may be formed of (e.g., may include) a seed metal layer 18a and a metal material pattern 18b, sequentially stacked such that the metal material pattern 18b is on the seed metal layer 18a. The seed metal layer 18a may include a Ti/Cu material or a Ti/W/Cu material. The seed metal layer 18a may be in contact with the lower conductive pattern 5. The metal material pattern 18b may include a Cu material.

A thickness of the seed metal layer 18a may be different from a thickness of the protective layer 10a.

A thickness of the seed metal layer 18a may be less than a maximum thickness of the protective layer 10a.

A thickness of the seed metal layer 18a may be greater than a maximum thickness of the protective layer 10a.

The thickness of the seed metal layer 18a may be the same or substantially the same as the maximum thickness of the protective layer 10a.

The thickness of the seed metal layer 18a may range from about 50 nm to about 500 nm.

The thickness of the seed metal layer 18a may range from about 150 nm to about 300 nm.

The upper redistribution pattern 30 may include a redistribution via 30v penetrating through the second insulating layer 25 and electrically connected to the lower redistribution pattern 20, and a redistribution line 30i extending from the redistribution via 30v and disposed on the second insulating layer 25. In the upper redistribution pattern 30, the redistribution via 30v may penetrate through the second insulating layer 25 and may contact the lower redistribution pattern 20. The upper redistribution pattern 30 may be formed of a seed metal layer 28a and a metal material pattern 28b, sequentially stacked. The seed metal layer 28a may include a Ti/Cu material or a Ti/W/Cu material. The metal material pattern 28b may include a Cu material. The third insulating layer 40 may cover an upper surface and a side surface of the upper redistribution pattern 30.

The upper conductive pattern 50 may be electrically connected to the upper redistribution pattern 30. The upper conductive pattern 50 may include a pad portion 50b located on a level higher than the upper surface of the insulating structure 45, for example, the upper surface 40U of the third insulating layer 40 (which may be a first surface of the redistribution substrate 60), and a via portion 50v extending downwardly (e.g., in the first direction perpendicular to the upper surface 5U of the lower conductive pattern 5) from at least a portion of the pad portion 50b and electrically connected to the redistribution structure 35. As shown in at least FIG. 1, the insulating structure 45 may cover at least a side surface of the redistribution structure 35. The insulating structure 45 may cover a side surface of the via portion 50v.

In the upper conductive pattern 50, the via portion 50v may penetrate through the third insulating layer 40 and may be electrically connected to the upper redistribution pattern 30. The pad portion 50b may be referred to as a bump part.

The upper conductive pattern 50 may be formed of a seed metal layer 48a and a metal material pattern 48b, sequentially stacked. The seed metal layer 48a may include a Ti/Cu material or a Ti/W/Cu material. The metal material pattern 48b may include a Cu material, a Ni material, an Au material, or a mixed material including at least two thereof.

The semiconductor package 1 may further include an upper connection pattern 120 between the redistribution substrate 60 and the semiconductor chip 100.

The lower connection pattern 150 may be electrically connected to the lower conductive pattern 5 of the redistribution substrate 60. The upper connection pattern 120 may be in contact with the upper conductive pattern 50. The upper connection pattern 120 may be electrically connected to the upper conductive pattern 50 of the redistribution substrate 60 and the pad 105 of the semiconductor chip 100 and may electrically connect the redistribution substrate 60 and the semiconductor chip 100. The pad 105 of the semiconductor chip 100 may be referred to as a bump. The upper connection pattern 120 may contact the upper conductive pattern 50 of the redistribution substrate 60, and may contact the pad 105 of the semiconductor chip 100.

The upper connection pattern 120 may have a land, ball, or pin shape. The upper connection pattern 120 may be formed of a low-melting-point metal. For example, the upper connection pattern 120 may include a solder material, for example, an alloy (e.g., Sn—Ag—Cu or the like) including tin (Sn).

The lower connection pattern 150 may include a low-melting-point metal, for example, tin (Sn) or an alloy (Sn—Ag—Cu) containing tin (Sn). The lower connection pattern 150 may be a land, a ball, or a pin. The lower connection pattern 150 may include a copper pillar or a solder ball.

The semiconductor package 1 may further include an underfill resin 130 disposed between the redistribution substrate 60 and the semiconductor chip 100 (e.g., plurality of semiconductor chips 100) and surrounding the side surface of the upper connection pattern 120. The underfill resin 130 may include an insulating resin such as an epoxy resin.

The semiconductor package 1 may further include an encapsulant 140 surrounding at least a side surface of the semiconductor chip 100, on the redistribution substrate 60. The encapsulant 140 may surround side surface of the semiconductor chip 100 and may cover upper surfaces of the semiconductor chips 100. The encapsulant 140 may cover at least a side surface of the semiconductor chip 100.

The encapsulant 140 may include an insulating material, for example, a resin such as epoxy molding compound (EMC) or Ajinomoto build-up film (ABF).

The underfill resin 130 may be formed in a molded under-fill (MUF) method to form a portion of the encapsulant 140.

In some example embodiments, the redistribution substrate 60 may have a first surface 40U and a second surface 15L (e.g., lower surface 15L of the first insulating layer 15) opposing each other (e.g., opposite surfaces in relation to each other), and the semiconductor chip 100 may be disposed on the first surface 40U of the redistribution substrate 60, and the lower connection pattern 150 may be disposed below the second surface 15L of the redistribution substrate 60.

Next, various modified examples of some components of the semiconductor package 1 described above will be described. Hereinafter, the components that may be modified or replaced, among the components of the semiconductor package 1, will be mainly described, and the remaining components will be described as components that may be modified by omitting or directly citing the description.

First, various modifications of the protective layer 10a and the lower conductive pattern 5 in FIG. 2A will be described with reference to FIGS. 3A to 3E, respectively. Each of FIGS. 3A to 3E is a partial enlarged view corresponding to FIG. 2A, and may represent a deformable or replaceable component among the components of FIG. 2A.

Figure 3A:
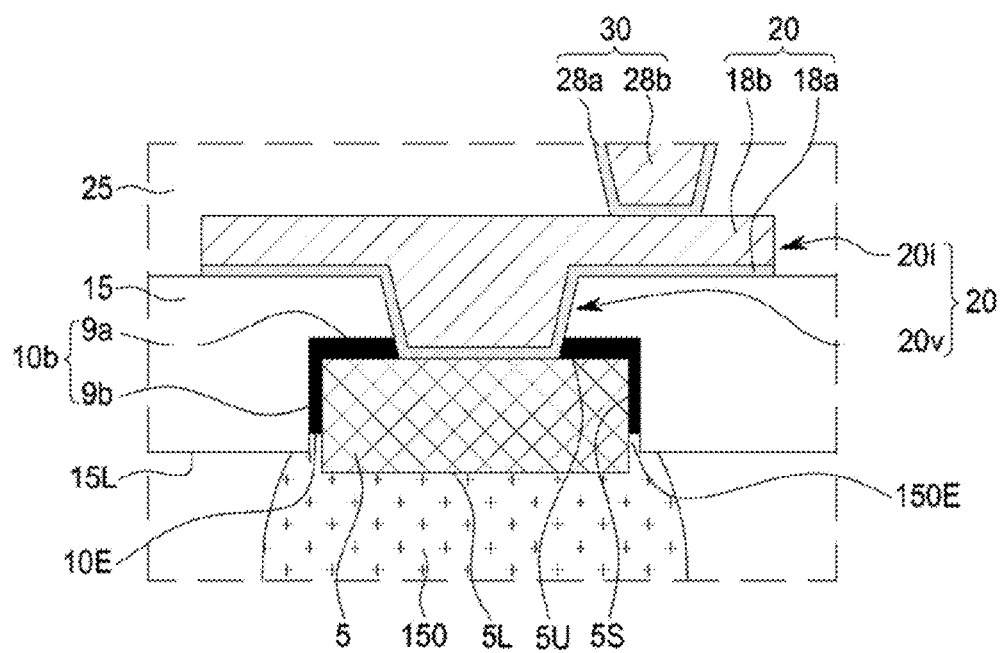
FIGS. 3A, 3B, 3C, 3D, and 3E are cross-sectional views respectively illustrating a modified example of a semiconductor package according to example embodiments.

In a modified example, referring to FIG. 3A, the protective layer 10b that may replace the protective layer 10a of FIG. 2A described in FIG. 2A may include a lower end (10E) located on (e.g., at) a level higher than the lower surface 15L of the first insulating layer 15 and thus may be located on (e.g., at) a level higher than the lower surface of the insulating structure 45. The second portion 9b of the protective layer 10b in contact with the side surface 5S of the lower conductive pattern 5 may have a shape recessed between the first insulating layer 15 and the lower conductive pattern 5. As shown, a lower end of the protective layer 10b (e.g., lower end 10E), a lower surface 5L of the insulating structure 45 (e.g., lower surface 15L), and a lower surface of the lower conductive pattern 5 may be at different levels (e.g., different positions in the first direction that is perpendicular to the upper surface 5U of the lower conductive pattern).

The lower end 10E of the protective layer 10b may be higher than the lower surface 15L of the first insulating layer 15, and the lower surface 5L of the lower conductive pattern 5 may be lower (e.g., located at a lower level) than the lower surface 15L of the first insulating layer 15.

The lower end 10E of the second portion 9b of the protective layer 10b may contact the lower connection pattern 150. Accordingly, the lower connection pattern 150 may include a portion 150E extending between the first insulating layer 15 and the side surface 5S of the lower conductive pattern 5. The lower connection pattern 150 may be in contact with both the lower end of the protective layer 10b (e.g., the lower end 10E of the second portion 9b) and the lower conductive pattern 5 (e.g., a lower surface 5L of the lower conductive pattern 5). The contact surface between the lower end 10E of the protective layer 10 and the lower connection pattern 150 may be located on (e.g., at) a level higher than the lower surface of the insulating structure 45, for example, the lower surface 15L of the first insulating layer 15.

Figure 3B:
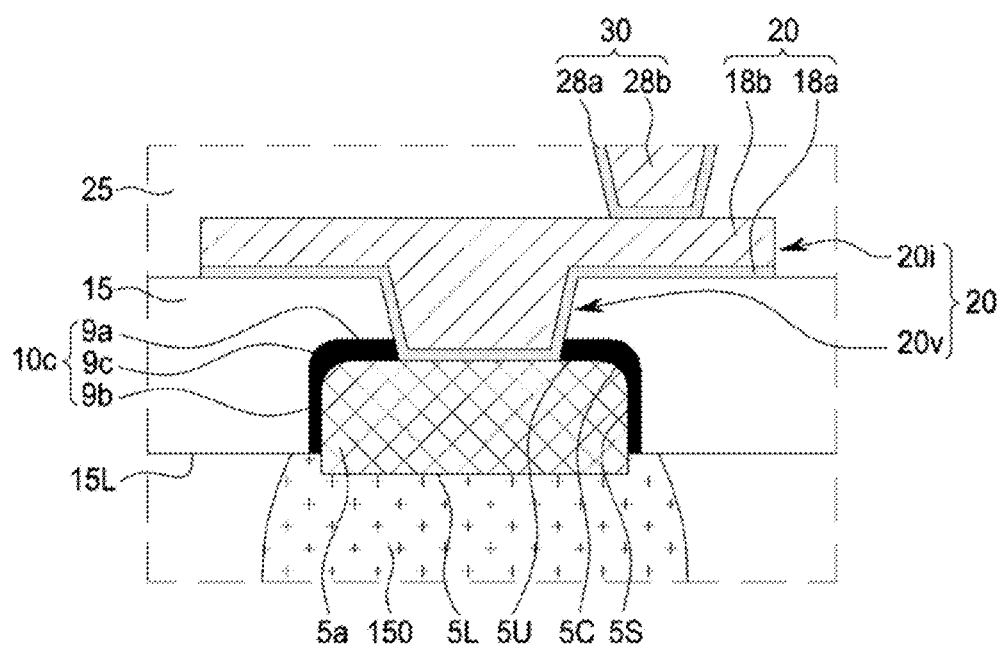

In a modified example, referring to FIG. 3B, the lower conductive pattern 5a that may replace the lower conductive pattern (see 5 in FIG. 2A) described in FIG. 2A may include a lower surface 5L, a flat or substantially flat upper surface 5U, an upper corner region 5C extending from the upper surface 5U and having an at least partially curved surface, and a side surface 5S extending from the upper corner region 5C. A lower end of a protective layer 10c and the lower surface 15L of the first insulating layer 15 may be located on the same or substantially the same level, and the lower surface 5L of the lower conductive pattern 5a may be lower than the lower surface 15L of the first insulating layer 15.

The protective layer 10c that may replace the protective layer (see 10a of FIG. 2A) described in FIG. 2A may include a first portion 9a in contact with the upper surface 5U of the lower conductive pattern 5a, a second portion 9b in contact with the side surface 5S of the lower conductive pattern 5a, and a curved corner region 9c in contact with the upper corner region 5C of the lower conductive pattern 5a.

Figure 3C:
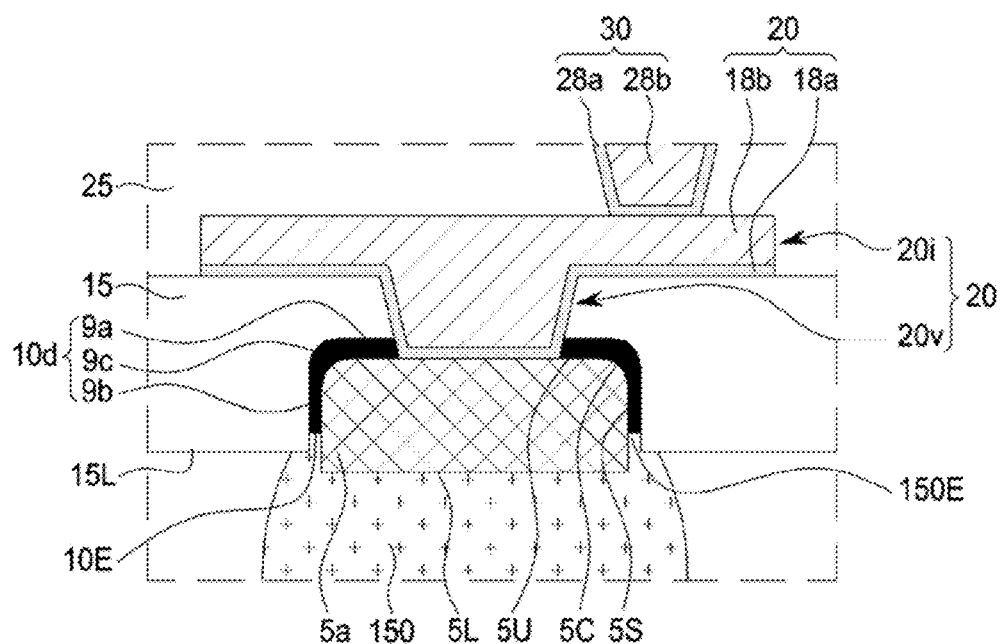

In a modified example, referring to FIG. 3C, the protective layer 10c described in FIG. 3B may be substituted with a protective layer 10d having a lower end 10E located on a level higher than the lower surface 15L of the first insulating layer 15. The second portion 9b of the protective layer 10c in contact with the side surface 5S of the lower conductive pattern 5a may have a shape recessed between the first insulating layer 15 and the lower conductive pattern 5. The lower surface 5L of the lower conductive pattern 5a may be lower than the lower surface 15L of the first insulating layer 15.

The lower end 10E of the second portion 9b of the protective layer 10c may contact the lower connection pattern 150. Accordingly, the lower connection pattern 150 may include a portion 150E extending between the first insulating layer 15 and the side surface 5S of the lower conductive pattern 5a.

Figure 3D:
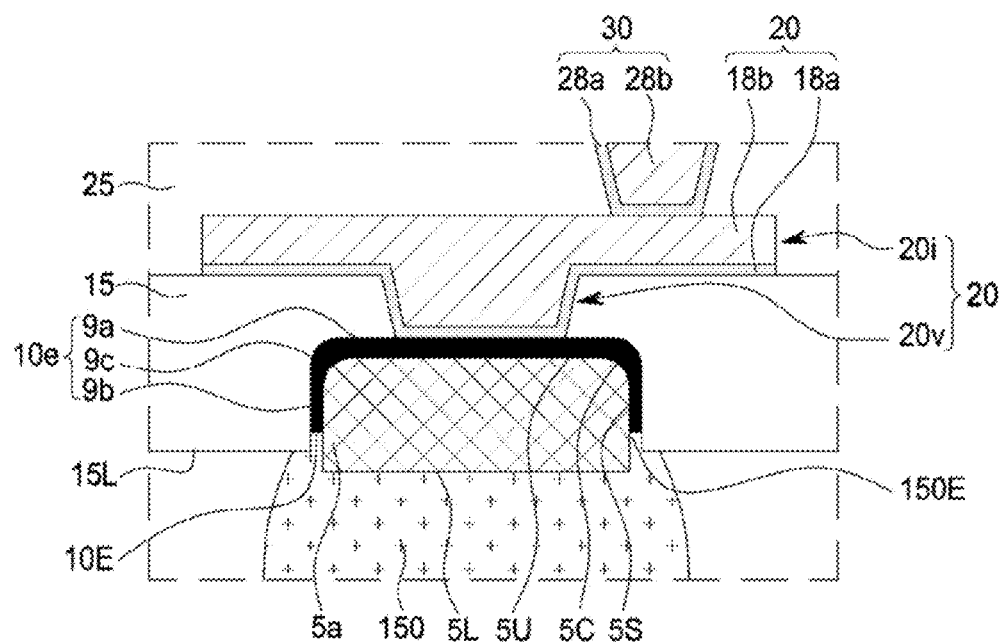

In a modified example, referring to FIG. 3D, the above-described protective layer (10a in FIGS. 1 and 2A, 10b in FIG. 3A, 10C in FIG. 3B, and 10d in FIG. 3C) may be in contact with a portion of the upper surface 5U of the lower conductive pattern 5, 5a. The protective layer in contact with a portion of the upper surface 5U of the lower conductive pattern 5, 5a (10a in FIGS. 1 and 2A, 10b in FIG. 3A, 10c in FIG. 3B, 10d in FIG. 3C) may be deformed to be in contact with the entire upper surface 5U of the lower conductive pattern 5, 5a. For example, as illustrated in FIG. 3D, the protective layer 10e in the modified example may contact the entire upper surface 5U of the lower conductive pattern 5a. A portion of the protective layer 10e may be disposed between the redistribution via 20v of the lower redistribution pattern 20 and the lower conductive pattern 5a.

Figure 3E:
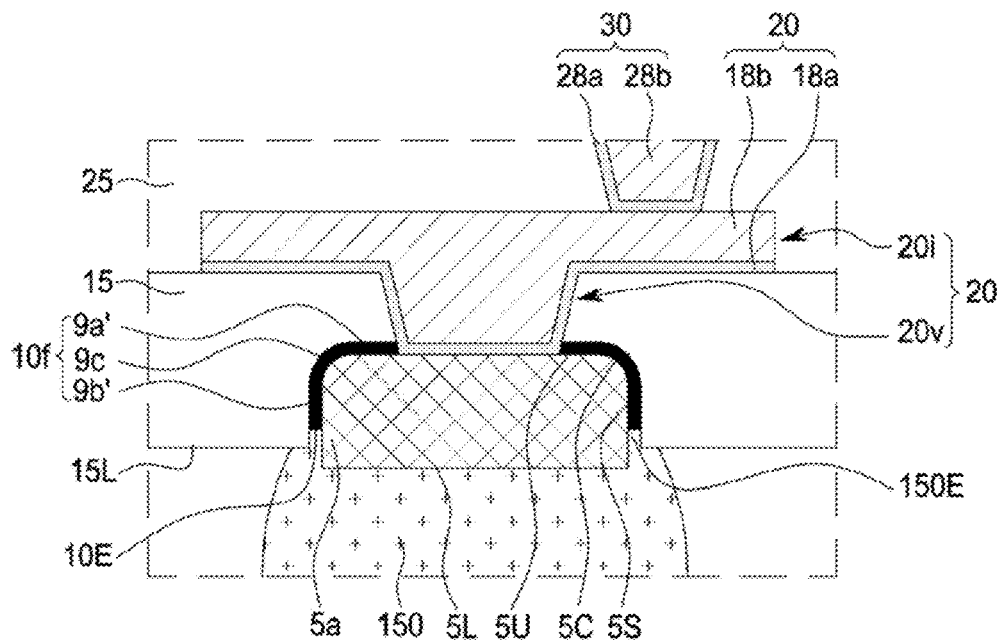

In a modified example, referring to FIG. 3E, the above-described protective layer (10a in FIGS. 1 and 2A, 10b in FIG. 3A, 10c in FIG. 3B, 10d in FIG. 3C, and 10e in FIG. 3D) may include a first portion 9a in contact with the upper surface 5U of the lower conductive pattern 5, 5*a*, and a second portion 9*b* in contact with the side surface 5S of the lower conductive pattern 5, 5*a* and having a thickness less than that of the first portion 9*a*. The protective layer (10*a* of FIGS. 1 and 2A, 10*b* of FIG. 3A, 10*c* of FIG. 3B, 10*d* of FIG. 3C, 10*e* in FIG. 3D) including the first portion 9*a* and the second portion 9*b* having different thicknesses as described above may be transformed into a protective layer having a uniform or substantially uniform thickness. For example, as in FIG. 3E, a protective layer 10*f* in the modified example may include a first portion 9*a'* in contact with the upper surface 5U of the lower conductive pattern 5*a*, and a second portion 9*b'* in contact with the side surface 5S of the lower conductive pattern 5*a* and having the same or substantially the same thickness as the first portion 9*a*.

The thickness of the protective layer 10*f* may range from about 30 nm to about 300 nm.

The thickness of the protective layer 10*f* may be about 100 nm.

Figure 4A:
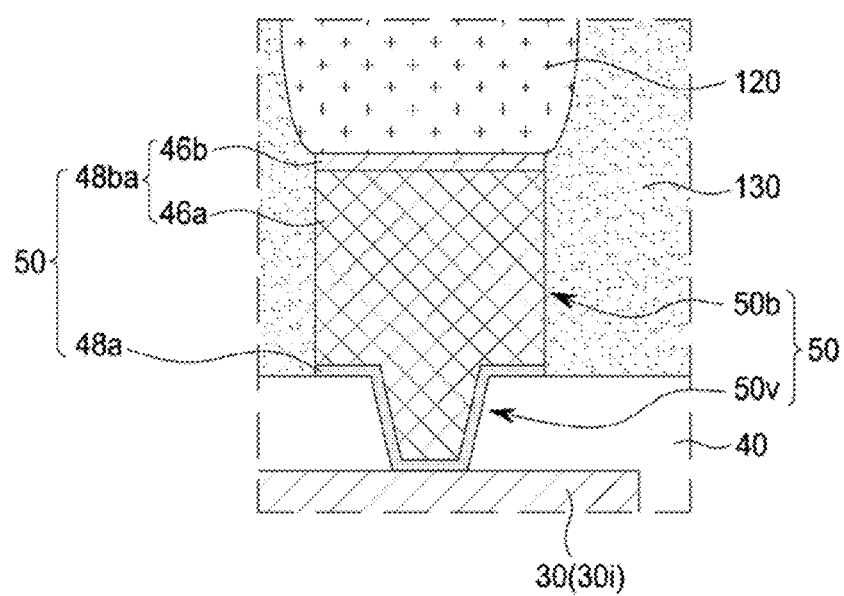
FIGS. 4A and 4B are cross-sectional views respectively illustrating a modified example of a semiconductor package according to example embodiments.
Figure 4B:
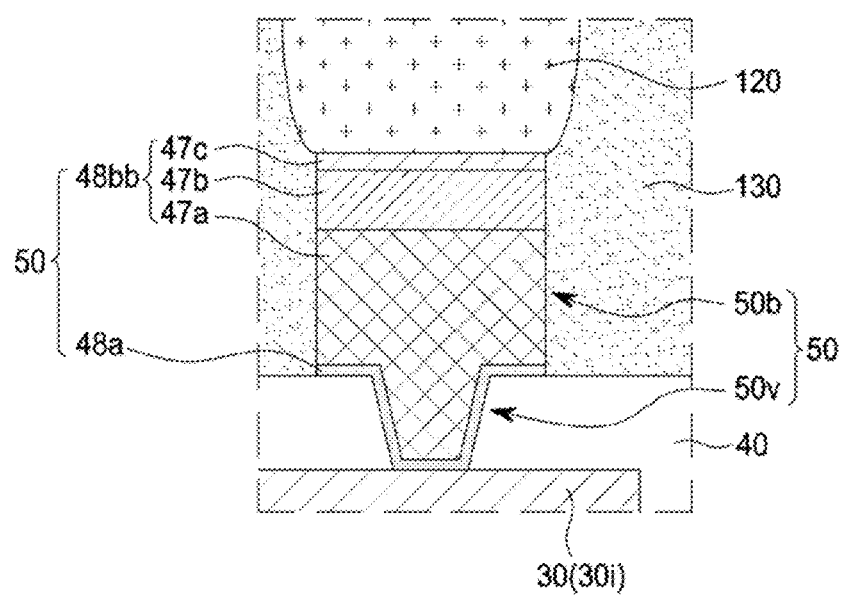

Next, various modifications of the metal material pattern 48*b* of the upper conductive pattern 50 of FIG. 2B will be described with reference to FIGS. 4A and 4B. Each of FIGS. 4A and 4B is a partial enlarged view corresponding to FIG. 2B, and may represent a modified example of the metal material pattern 48*b* of FIG. 2B.

In a modified example, referring to FIG. 4A, the metal material pattern 48*b* of the upper conductive pattern 50 described with reference to FIG. 2B may be formed of a single material layer, for example, a copper (Cu) layer. The metal material pattern (48*b* in FIG. 2B) of the single material layer may be replaced with a metal material pattern 48*ba* including the first material layer 46*a* and the second material layer 46*b* sequentially stacked. The first material layer 46*a* may contact the seed metal layer 48*a*, and the second material layer 46*b* may contact the lower connection pattern 150. The first material layer 46*a* may be thicker than the second material layer 46*b*. The first material layer 46*a* may be a nickel (Ni) layer, and the second material layer 46*b* may be a gold (Au) layer.

In a modified example, referring to FIG. 4B, the metal material pattern (48*b* in FIG. 2B) described with reference to FIG. 2B may be replaced with a metal material pattern 48*bb* including a first material layer 47*a*, a second material layer 47*b*, and a third material layer 47*c* sequentially stacked. The first material layer 47*a* may be thicker than the second material layer 47*b*, and the second material layer 47*b* may be thicker than the third material layer 47*c*. The first material layer 47*a* may contact the seed metal layer 48*a*, and the third material layer 47*c* may contact the lower connection pattern 150. The first material layer 47*a* may be a copper (Cu) layer, the second material layer 47*b* may be a nickel (Ni) layer, and the third material layer 47*c* may be a gold (Au) layer.

Next, various examples of a semiconductor package according to example embodiments will be described with reference to FIGS. 5A to 5E, respectively.

Figure 5A:
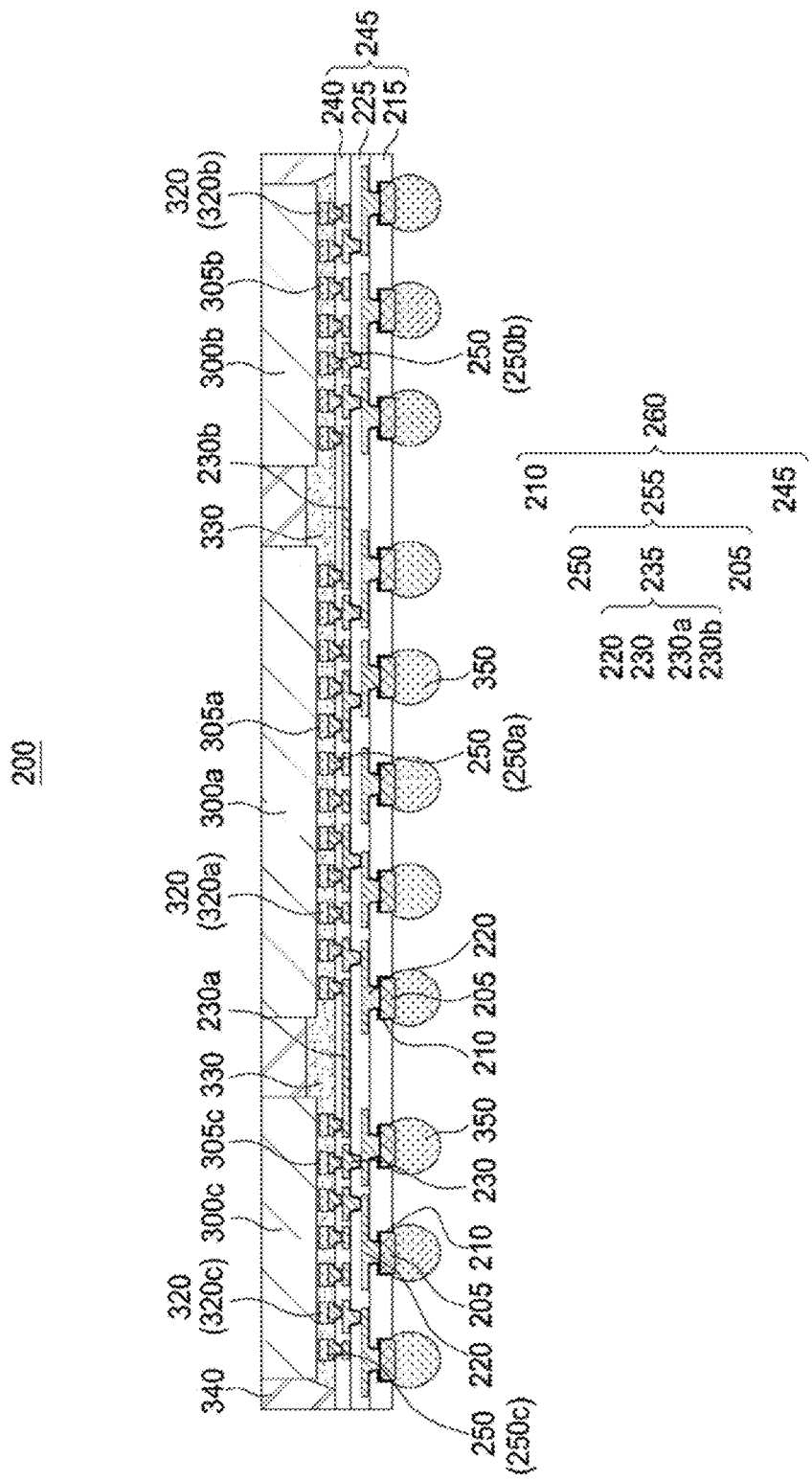
FIG. 5A is a cross-sectional view illustrating an example of a semiconductor package according to example embodiments.

In an example, referring to FIG. 5A, a semiconductor package 200 may include a redistribution substrate 260 and a plurality of semiconductor chips 300*a*, 300*b*, and 300*c* disposed on the redistribution substrate 260.

The redistribution substrate 260 may have a structure similar to that of the redistribution substrate 60 described with reference to FIG. 1. For example, the redistribution substrate 260 may include a conductive structure 255, a protective layer 210, and an insulating structure 245.

The insulating structure 245 may include a first insulating layer 215, a second insulating layer 225, and a third insulating layer 240, sequentially stacked. The first to third insulating layers 215, 225, and 240 may correspond to the first to third insulating layers 15, 25, and 40 of FIG. 1, respectively.

The conductive structure 255 may include lower conductive patterns 205, a redistribution structure 235 on the lower conductive patterns 205, and an upper conductive pattern 250 (e.g., upper connective patterns 250*a*, 250*b*, 250*c*) on the redistribution structure 235. Each of the lower conductive patterns 205 may be the same or substantially the same as any one of the lower conductive patterns 5 and 5*a* described with reference to FIGS. 1 to 3E. Each of the upper conductive patterns 250 may be the same or substantially the same as an upper conductive pattern of any one of the upper conductive patterns 50 described with reference to FIGS. 1, 2B, 4A, and 4B.

The redistribution structure 235 may include lower redistribution patterns 220 and upper redistribution patterns 230 on the lower redistribution patterns 220. Each of the lower redistribution patterns 220 may be the same or substantially the same as the lower redistribution pattern 20 described with reference to FIG. 1. For example, as in FIG. 1, each of the lower conductive patterns 205 may include a redistribution via penetrating through the first insulating layer 215, and a redistribution line extending from the redistribution via and disposed on the first insulating layer 215. At least some of the upper redistribution patterns 230 may be the same or substantially the same as the upper redistribution pattern 30 described with reference to FIG. 1. For example, at least some of the upper redistribution patterns 230 may include a redistribution via penetrating through the second insulating layer 225, and a redistribution line extending from the redistribution via and disposed on the second insulating layer 225, as in FIG. 1.

The redistribution substrate 260 may further include redistribution connection lines 230*a* and 230*b* electrically connecting at least two semiconductor chips of the plurality of semiconductor chips 300*a*, 300*b*, and 300*c*. For example, the redistribution connection lines 230*a* and 230*b* may include first and second redistribution connection lines 230*a* and 230*b* located on a height level with the redistribution line of the upper redistribution patterns 230.

The plurality of semiconductor chips 300*a*, 300*b*, and 300*c* may be spaced apart from each other in a direction parallel to the upper surface of the insulating structure 245. Each of the plurality of semiconductor chips 300*a*, 300*b*, and 300*c* may be electrically connected to the redistribution substrate 260. The plurality of semiconductor chips 300*a*, 300*b*, and 300*c* may include a first semiconductor chip 300*a*, a second semiconductor chip 300*b*, and a third semiconductor chip 300*c*.

The first semiconductor chip 300*a* may be a processor chip such as a central processor unit (CPU) or a graphic processor unit (GPU), or a logic chip such as an application-specific IC (ASIC). At least one of the second semiconductor chip 300*b* and the third semiconductor chip 300*c* may be a stacked chip structure including sequentially stacked semiconductor chips. For example, at least one of the second semiconductor chip 300*b* and the third semiconductor chip 300*c* may include a memory chip. For example, at least one of the second semiconductor chip 300*b* and the third semiconductor chip 300*c* may be a high bandwidth memory (HBM). For example, at least one of the second semiconductor chip 300*b* and the third semiconductor chip 300*c* may include a buffer die (or logic die) and DRAM chips sequentially stacked on the buffer die (or logic die).

The semiconductor package 200 may further include upper connection patterns 320 (e.g., patterns 320a, 320b, 320c) electrically connecting the plurality of semiconductor chips 300a, 300b, and 300c to the redistribution substrate 260.

The first semiconductor chip 300a may be electrically connected to each of the second and third semiconductor chips 300b and 300c through the first and second redistribution connection lines 230a and 230b. For example, the first redistribution connection line 230a may electrically connect the first semiconductor chip 300a and the third semiconductor chip 300c, and the second redistribution connection line 230b may electrically connect the first semiconductor chip 300a and the second semiconductor chip 300b to each other.

The semiconductor package 200 may further include lower connection patterns 350 contacting the lower conductive patterns 205 and the protective layers 210, below the redistribution substrate 260. For example, one lower connection pattern 350 may contact one lower conductive pattern 205 and one protective layer 210, similarly to the lower connection pattern 150 of FIG. 2A.

The semiconductor package 200 may further include an underfill resin 330 surrounding the side surfaces of the upper connection patterns 320, between the plurality of semiconductor chips 300a, 300b and 300c and the redistribution substrate 260. The semiconductor package 200 may further include an encapsulant 340 surrounding at least side surfaces of the plurality of semiconductor chips 300a, 300b, and 300c, on the redistribution substrate 260.

Figure 5B:
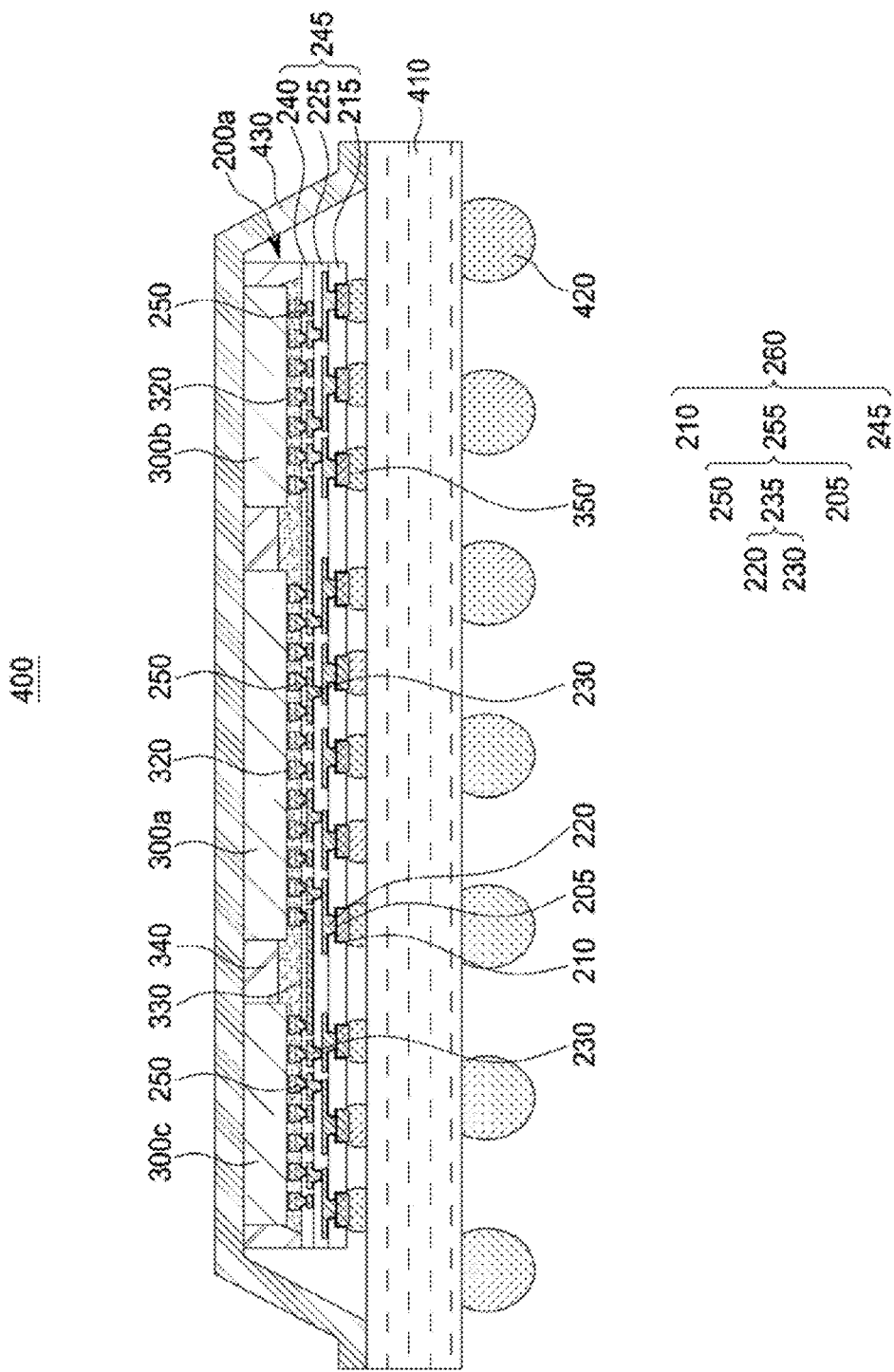
FIG. 5B is a cross-sectional view illustrating another example of a semiconductor package according to example embodiments.

In another example, referring to FIG. 5B, a semiconductor package 400 may include a base substrate 410, a package 200a mounted on the base substrate 410, a heat dissipation structure 430 covering the semiconductor package 200, on the base substrate 410, and a connection pattern 420 below the base substrate 410. The connection pattern 420 may include solder balls or conductive bumps.

The package 200a may be formed by mounting the semiconductor package 200 described with reference to FIG. 5A on the base substrate 410. Accordingly, the package 200a may include the redistribution substrate 260 and the plurality of semiconductor chips 300a, 300b, and 300c, the same as the semiconductor package 200 of FIG. 5A. The lower connection patterns 350 of the semiconductor package 200 described with reference to FIG. 5A may be bonded to the base substrate 410 to form lower connection patterns 350'.

The base substrate 410 may include a silicon interposer, a redistribution interposer, a printed circuit board (PCB), a ceramic substrate, a glass substrate, or a tape wiring substrate.

The heat dissipation structure 430 may be disposed on the base substrate 410 and may cover the package 200a. The heat dissipation structure 430 may be attached to the base substrate 410 and/or the package 200a by an adhesive. The heat dissipation structure 430 may include a conductive material having excellent thermal conductivity capable of dissipating heat. For example, the heat dissipation structure 430 may be formed of a metal or a metal alloy including gold (Au), silver (Ag), copper (Cu), iron (Fe) or the like, or a conductive material such as graphite, graphene, or the like. The conductive material of the heat dissipation structure 430 is not limited to the above-described material. The heat dissipation structure 430 may have a shape different from that illustrated in FIG. 5B.

Figure 5C:
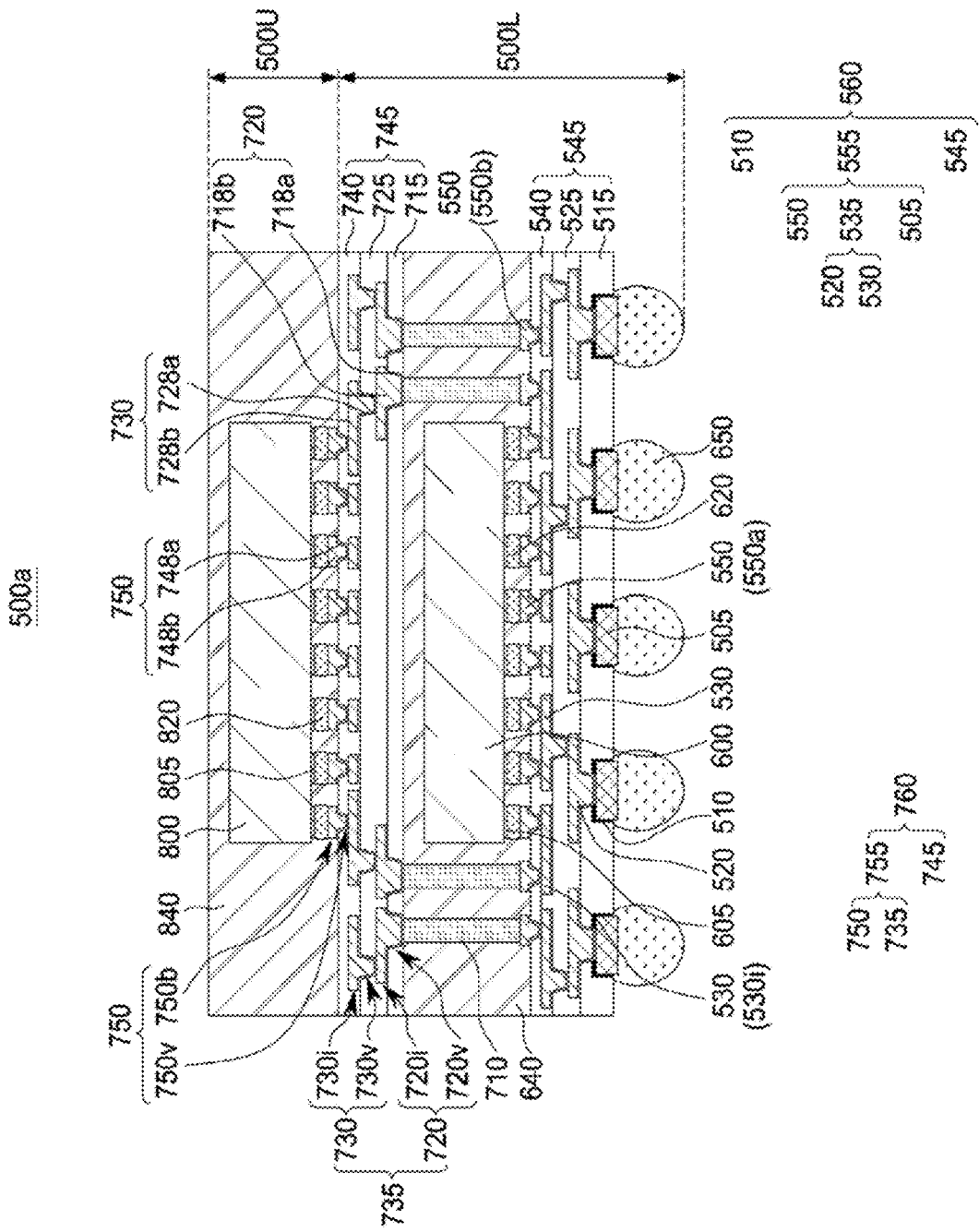
FIG. 5C is a cross-sectional view illustrating another example of a semiconductor package according to example embodiments.

In another example, referring to FIG. 5C, the semiconductor package 500a may include a first structure 500L and a second structure 500U on the first structure 500L.

The first structure 500L may include a lower redistribution substrate 560 and a first semiconductor chip 600 disposed on the lower redistribution substrate 560.

The lower redistribution substrate 560 may have a structure similar to that of the redistribution substrate 60 described with reference to FIG. 1. For example, the lower redistribution substrate 560 may include a conductive structure 555, a protective layer 510, and an insulating structure 545.

The insulating structure 545 may include a first insulating layer 515, a second insulating layer 225, and a third insulating layer 540, sequentially stacked. The first to third insulating layers 515, 525, and 540 may correspond to the first to third insulating layers 15, 25, and 40 of FIG. 1, respectively.

The conductive structure 555 may include lower conductive patterns 505, a redistribution structure 535 on the lower conductive patterns 505, and upper conductive patterns 550 on the redistribution structure 535. Each of the lower conductive patterns 505 may be the same or substantially the same as any one of the lower conductive patterns 5 and 5a described with reference to FIGS. 1 to 3E. Each of the upper conductive patterns 550 may be the same or substantially the same as any one of the upper conductive patterns 50 described with reference to FIGS. 1, 2B, 4A, and 4B.

The upper conductive patterns 550 may include a first upper conductive pattern 550a overlapping the first semiconductor chip 600 and electrically connected to the first semiconductor chip 600, and a second upper conductive pattern 550b that does not overlap the first semiconductor chip 600.

The redistribution structure 535 may include lower redistribution patterns 520 and upper redistribution patterns 530 on the lower redistribution patterns 520. Each of the lower redistribution patterns 520 may be the same or substantially the same as the lower redistribution pattern 20 described with reference to FIG. 1. For example, as in FIG. 1, each of the lower conductive patterns 505 may include a redistribution via penetrating through the first insulating layer 515, and a redistribution line extending from the redistribution via and disposed on the first insulating layer 515. At least some of the upper redistribution patterns 530 may be the same or substantially the same as the upper redistribution patterns 30 described with reference to FIG. 1. For example, at least some of the upper redistribution patterns 530, similarly to FIG. 1, may include a redistribution via penetrating through the second insulating layer 525, and a redistribution line extending from the redistribution via and disposed on the second insulating layer 525. A portion of the upper redistribution patterns 530 may be a redistribution connection line 530i formed to be the same as the redistribution line on the second insulating layer 525.

The first structure 500L may further include lower connection patterns 650 in contact with the lower conductive patterns 505 and the protective layers 510, below the lower redistribution substrate 560. Each of the lower connection patterns 650 may contact one lower conductive pattern 505 and one protective layer 510, similarly to the lower connection pattern 150 of FIG. 2.

The first structure 500L may further include a first encapsulant 640, covering at least a side surface of the first semiconductor chip 600, and covering side surfaces of the upper connection patterns 320, between the first semiconductor chip 600 and the lower redistribution substrate 560.

The first encapsulant 640 may cover an upper surface of the first semiconductor chip 600. The first encapsulant 640 may cover at least a side surface of the first semiconductor chip 600 and surrounding a side surface of the upper connection pattern 620, and the first encapsulant 640 may be between the first semiconductor chip 600 and the lower redistribution substrate 560. The upper connection pattern 620 may connect a pad 605 of the first semiconductor chip 600 and the upper conductive pattern 550.

The first structure 500L may further include a vertical connection pattern 710 penetrating through the first encapsulant 640 and electrically connected to the second upper conductive pattern 550b and thus electrically connected to a portion of the conductive structure of the redistribution substrate 560. The vertical connection pattern 710 may be formed of a conductive material.

The first structure 500L may further include an upper redistribution substrate 760 disposed on the first encapsulant 640 and the first semiconductor chip 600.

The upper redistribution substrate 760 may include an upper insulating structure 745 and a conductive structure 755. The conductive structure 755 may include an upper redistribution structure 735 and an upper conductive pattern 750.

The upper insulating structure 745 may include the same or substantially the same material as the insulating structure 45 described with reference to FIG. 1. The upper insulating structure 745 may include a first upper insulating layer 715, a second upper insulating layer 725, and a third upper insulating layer 740, sequentially stacked. In the drawing, the upper insulating structure 745 shows three insulating layers 715, 725, and 740, but the example embodiments are not limited thereto, and the upper insulating structure 745 may be comprised of two or four or more insulating layers.

The upper redistribution structure 735 may include a plurality of redistribution patterns 720 and 730 located on different height levels. For example, the plurality of redistribution patterns 720 and 730 may include a lower redistribution pattern 720 and an upper redistribution pattern 730. In FIG. 5C, the plurality of redistribution patterns 720 and 730 illustrate two redistribution patterns located on different levels, but the example embodiments of the present inventive concepts are not limited thereto. For example, the upper redistribution structure 735 may be comprised of the lower redistribution pattern 720 by omitting the upper redistribution pattern 730, or may be comprised of three or more redistribution patterns located on different levels.

In the upper redistribution structure 735, the lower redistribution pattern 720 may include a redistribution via 720v penetrating through the first upper insulating layer 715 and electrically connected to the vertical connection pattern 710, and a redistribution line 720i extending from the redistribution via 720v and disposed on the first upper insulating layer 715. The lower redistribution pattern 720 may be formed of a seed metal layer 718a and a metal material pattern 718b, sequentially stacked.

In the upper redistribution structure 735, the upper redistribution pattern 730 may be electrically connected to the vertical connection pattern 710 and may include a redistribution via 730v penetrating through the second upper insulating layer 725 and electrically connected to the lower redistribution pattern 720, and a redistribution line 730i extending from the redistribution via 730v and disposed on the second upper insulating layer 725. The redistribution via 730v may extend downwardly from a portion of the redistribution line 730i. The upper redistribution pattern 730 may be formed of a seed metal layer 728a and a metal material pattern 728b, sequentially stacked.

The upper conductive pattern 750 may include a pad via 750i penetrating through the third upper insulating layer 740 and electrically connected to the upper redistribution pattern 730, and a pad portion 750b on the third upper insulating layer 740. The upper conductive pattern 750 may be formed of a seed metal layer 748a and a metal material pattern 748b, sequentially stacked.

The second structure 500U may include a second semiconductor chip 800 disposed on the first structure 500L. The second semiconductor chip 800 may be an upper semiconductor chip that is on the first encapsulant 640 and the first semiconductor chip 600. The second semiconductor chip 800 may be on the upper redistribution substrate 760.

The second structure 500U may further include a connection pattern 820 electrically connecting a pad 805 of the second semiconductor chip 800 and the upper conductive pattern 750, between the pad 805 of the second semiconductor chip 800 and the upper conductive pattern 750 of the upper redistribution substrate 760. The connection pattern 820 may be the same or substantially the same as the upper connection pattern 120 of FIG. 1.

The second structure 500U may further include a second encapsulant 840 covering at least a side surface of the second semiconductor chip 800, on the first structure 500L, and covering the side surface of the connection pattern 820, between the second semiconductor chip 800 and the upper redistribution substrate 760. The second encapsulant 840 may cover an upper surface of the second semiconductor chip 800.

At least one of the first semiconductor chip 600 and the second semiconductor chip 800 may be a logic chip such as a microprocessor such as a central processor unit (CPU), a graphic processor unit (GPU), an application processor (AP) or the like, a field programmable gate array (FPGA), an application-specific IC (ASIC) or the like, or a memory chip. For example, the first semiconductor chip 600 may be a logic chip such as a microprocessor such as a central processor unit (CPU), a graphic processor unit (GPU), an application processor (AP) or the like, or a field programmable gate array (FPGA), application-specific IC (ASIC), or the like, and the second semiconductor chip 800 may include a memory chip.

In another example, one of the first semiconductor chip 600 and the second semiconductor chip 800 may be a volatile memory chip or a non-volatile memory chip, and the other may be a control semiconductor chip for driving the memory chip. For example, the first semiconductor chip 600 may be a control semiconductor chip, and the second semiconductor chip 800 may be a volatile memory chip or a non-volatile memory chip.

Figure 5D:
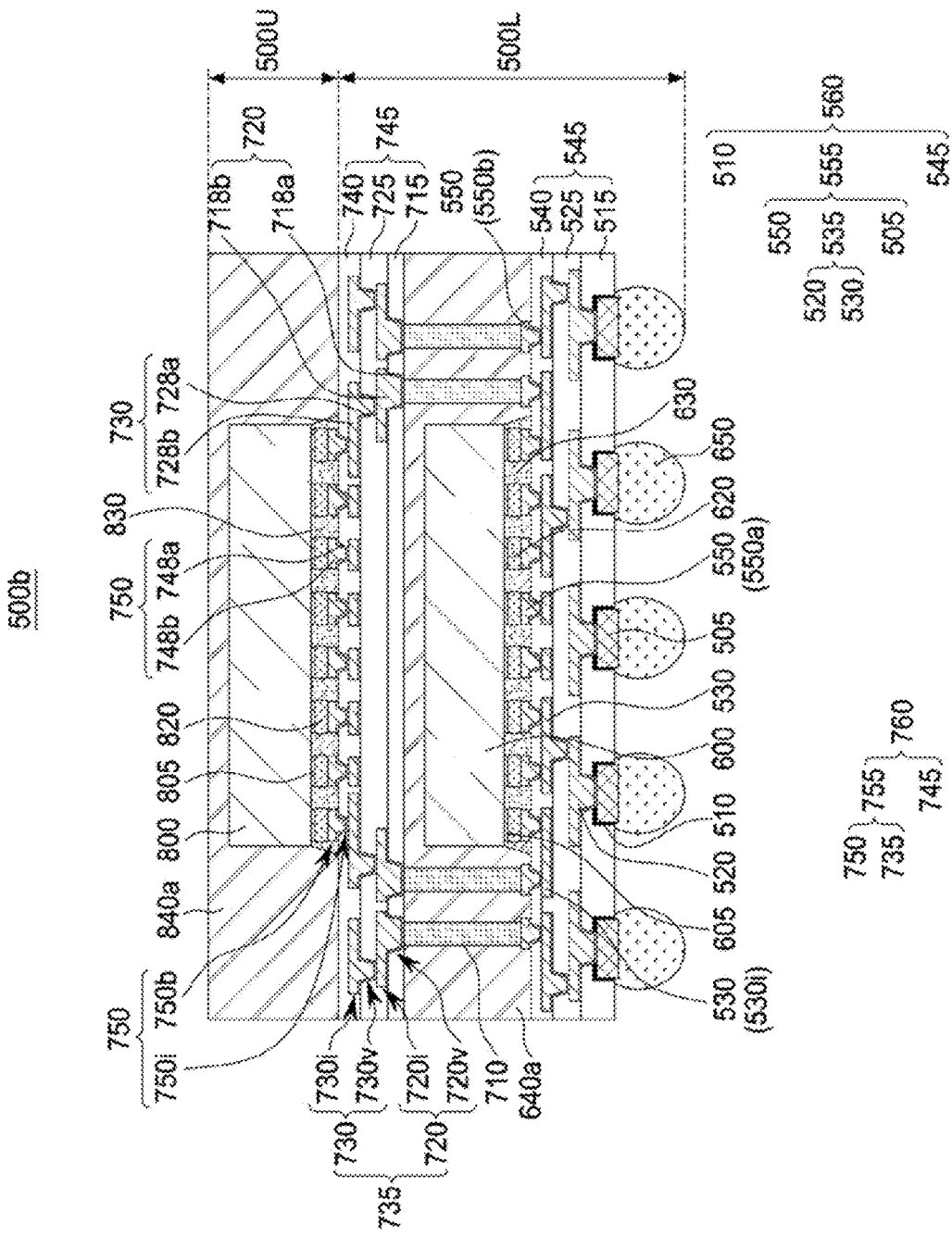
FIG. 5D is a cross-sectional view illustrating another example of a semiconductor package according to example embodiments.

In another example, referring to FIG. 5D, the semiconductor package 500b may include a first structure 500L and a second structure 500U on the first structure 500L, and a portion of the first encapsulant (640 of FIG. 5C) described with reference to FIG. 5C may be replaced with an underfill resin. For example, the first encapsulant (640 of FIG. 5C) described with reference to FIG. 5C may be replaced with an underfill resin 630 surrounding the side surface of the upper connection pattern 620, between the first semiconductor chip 600 and the lower redistribution substrate 560, and an encapsulant 640a covering the side and upper surfaces of the first semiconductor chip 600, on the lower redistribution substrate 560. A portion of the second encapsulant (840 of FIG. 5C) described with reference to FIG. 5C may be replaced with an underfill resin. For example, the second encapsulant (840 of FIG. 5C) described with reference to FIG. 5C may be replaced with an underfill resin 830 surrounding the side surface of the connection pattern 820, between the second semiconductor chip 800 and the upper redistribution substrate 760, and an encapsulant 840a covering the side and upper surfaces of the second semiconductor chip 800, on the upper redistribution substrate 760.

Figure 5E:
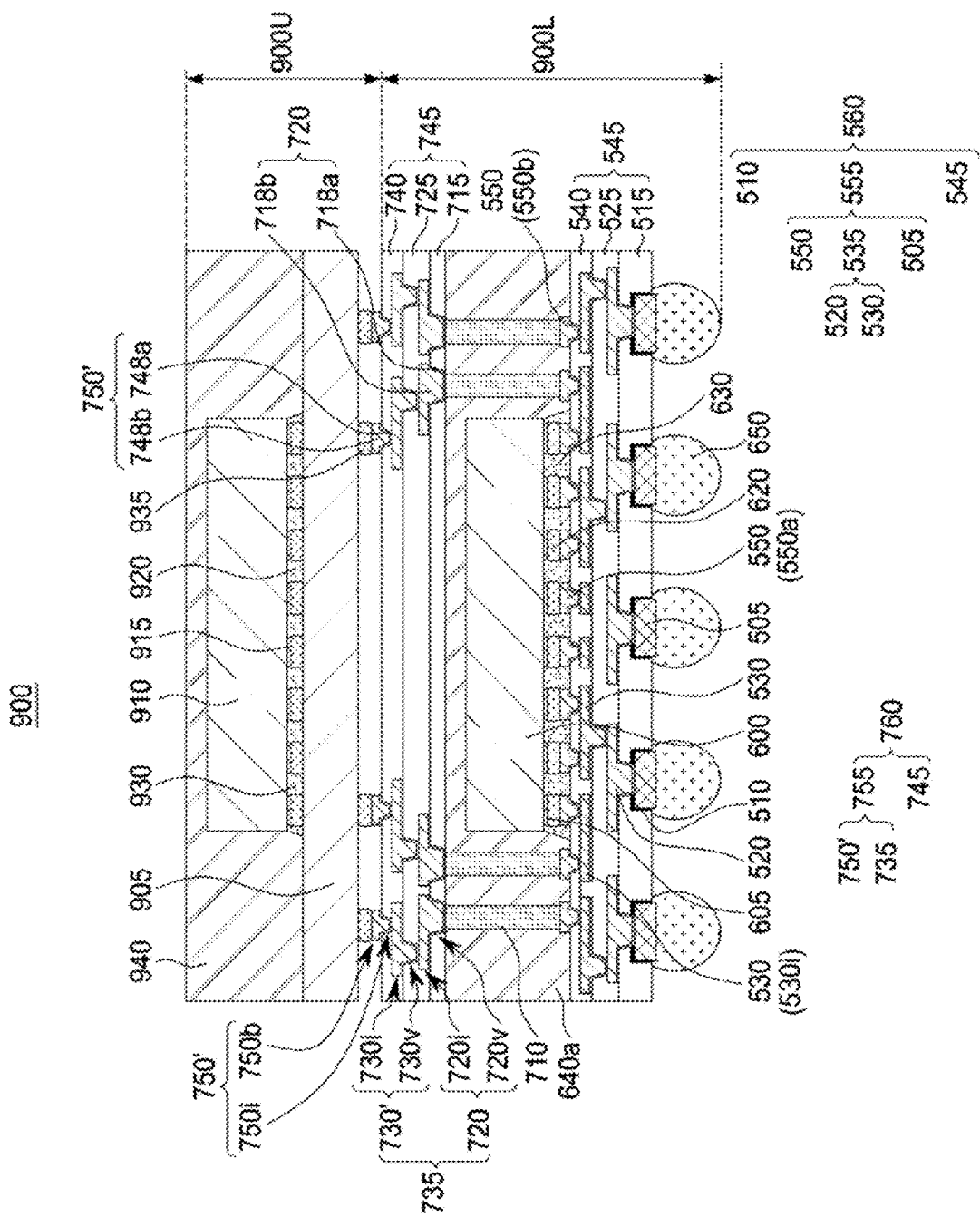
FIG. 5E is a cross-sectional view illustrating another example of a semiconductor package according to example embodiments.

In another example, referring to FIG. 5E, a semiconductor package 900 may include a first structure 900L and a second structure 900U on the first structure 900L. The first structure 900L may be the same or substantially the same as or similar to the first structure 500L of any one of the first structures 500L of FIGS. 5C and 5D. For example, in FIG. 5D, the first structure 900L may include all components of the first structure 500L except for the upper redistribution pattern 730 and the upper conductive pattern 750, and may include an upper redistribution pattern 730' and an upper conductive pattern 750' respectively corresponding to the upper redistribution pattern 730 and the upper conductive pattern 750 described with reference to FIG. 5D.

The upper redistribution pattern 730' and the upper conductive pattern 750' may have the same or substantially the same cross-sectional structure as the upper redistribution pattern 730 and the upper conductive pattern 750 described with reference to FIG. 5D.

The second structure 900U may include a package substrate 905, a connection pattern 935 electrically connecting the package substrate 905 and the upper conductive pattern 750' of the first structure 900L, between the package substrate 905 and the upper conductive pattern 750' of the first structure 900L, and a second semiconductor chip 910 mounted on the package substrate 905. The package substrate 905 may be a printed circuit board or an interposer board.

The second semiconductor chip 910 may be mounted on the package substrate 905 in a flip-chip structure or a wire bonding structure. For example, when the second semiconductor chip 910 is mounted on the package substrate 905 in a flip-chip structure, the second structure 900U may include a connection pattern 920 electrically connecting a pad 915 of the second semiconductor chip 910 and the package substrate 905, between the pad 915 of the second semiconductor chip 910 and the package substrate 905.

The second structure 900U may further include an underfill resin 930 surrounding a side surface of the connection pattern 920, between the pad 915 of the second semiconductor chip 910 and the package substrate 905, and an encapsulant 940 surrounding at least a side surface of the second semiconductor chip 910, on the package substrate 905. In another example, the underfill resin 930 and the encapsulant 940 may be formed of one material in one process.

Next, an example of a method of manufacturing a semiconductor package according to example embodiments will be described with reference to FIGS. 6 to 11.

Figure 6:
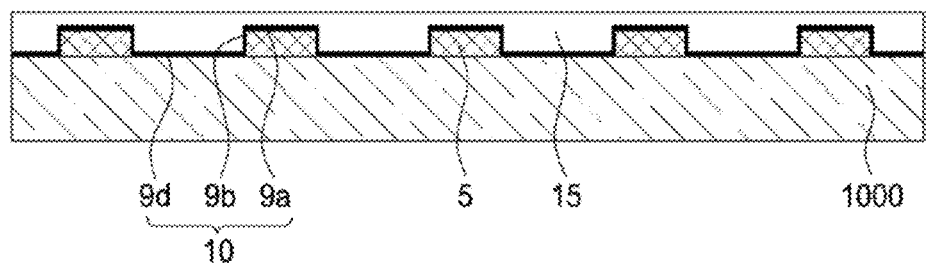
FIGS. 6, 7, 8, 9, 10, and 11 are cross-sectional views illustrating a method of manufacturing a semiconductor package according to example embodiments.

Referring to FIG. 6, a lower conductive pattern 5 may be formed on a carrier 1000. The lower conductive pattern 5 may have the same shape as any one of the lower conductive patterns 5 and 5a described with reference to FIGS. 1 to 3E. The lower conductive pattern 5 may be provided as a plurality of lower conductive patterns. A protective layer 10 covering a surface of the carrier 1000 that does not overlap the lower conductive pattern 5, and an upper surface and a side surface of the lower conductive pattern 5, may be formed on the carrier 1000. The protective layer 10 may include a first portion 9a covering an upper surface of the lower conductive pattern 5, a second portion 9b covering a side surface of the protective layer 10, and a third portion 9d covering the surface of the carrier 1000.

The protective layer 10 may be formed of the same material as the protective layers 10 and 10a to 10f described with reference to FIGS. 1 to 3E.

In an example, the thickness of a portion of the protective layer 10, covering the upper surface of the lower conductive pattern 5, and the surface of the carrier 1000 that does not overlap the lower conductive pattern 5, may be greater than a thickness of a portion covering a side surface of the lower conductive pattern 5.

In another example, the protective layer 10 may be formed to have a uniform or substantially uniform thickness.

A first insulating layer 15 may be formed on the protective layer 10. The first insulating layer 15 may be the same as the first insulating layer 15 described with reference to FIG. 1.

Figure 7:
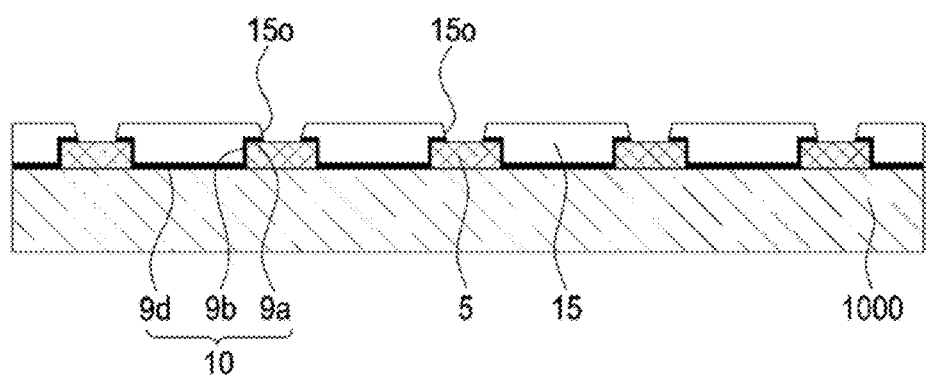

Referring to FIG. 7, an opening 15o penetrating through the first insulating layer 15 and the protective layer 10 and exposing a portion of the lower conductive pattern 5 may be formed.

Figure 8:
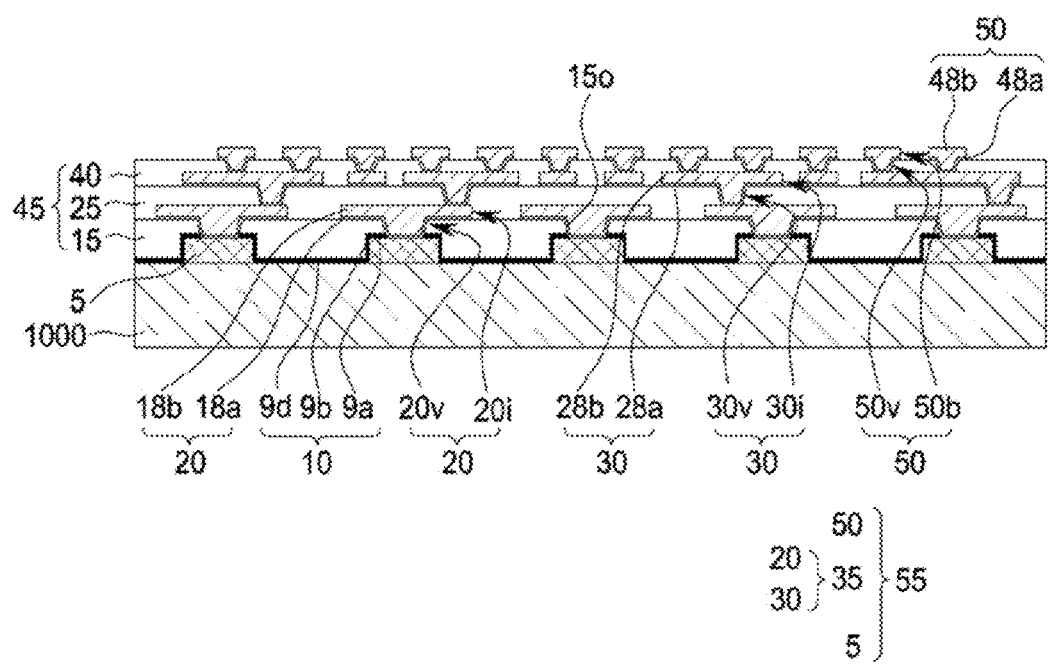

Referring to FIG. 8, a lower redistribution pattern 20 may be formed to include a redistribution via 20v in contact with the lower conductive pattern 5 while filling the opening 15o, and a redistribution line 20i extending from the redistribution via 20v and disposed on the first insulating layer 15. The lower redistribution pattern 20 may be formed using a plating process. For example, in forming the lower redistribution pattern 20, a seed metal layer 18a is formed, a metal material pattern 18b is formed on the seed metal layer 18a by a plating process, and the seed metal layer 18a and the metal material pattern 18b may be patterned.

A second insulating layer 25 covering the lower redistribution pattern 20 may be formed on the first insulating layer 15 and the lower redistribution pattern 20. An upper redistribution pattern 30 including a redistribution via 30v penetrating through the second insulating layer 25 and in contact with the lower redistribution pattern 20, and a redistribution line 30i extending from the redistribution via 30v and formed on the second insulating layer 25, may be formed. The upper redistribution pattern 30 may be formed in the same or substantially the same process as the lower redistribution pattern 20. The upper redistribution pattern 30 may include a seed metal layer 28a and a metal material pattern 28b sequentially stacked. Accordingly, the redistribution structure 35 including the lower redistribution pattern 20 and the upper redistribution pattern 30, the same as described with reference to FIG. 1, may be formed.

A third insulating layer 40 covering the upper redistribution pattern 30 may be formed on the second insulating layer 25 and the upper redistribution pattern 30. Accordingly, an insulating structure 45 including the first to third insulating layers 15, 25, and 40 as described with reference to FIG. 1 may be formed.

An upper conductive pattern 50 including, a via portion 50v penetrating through the third insulating layer 40 and contacting the upper redistribution pattern 30, and a pad portion 50b extending from the via portion 50v and formed on the third insulating layer 40, may be formed. The upper conductive pattern 50 may be formed of a seed metal layer 48a and a metal material pattern 48b, sequentially stacked. Accordingly, the conductive structure 55 including the lower conductive pattern 5, the redistribution structure 35, and the upper conductive pattern 50 as described with reference to FIG. 1 may be formed.

Figure 9:
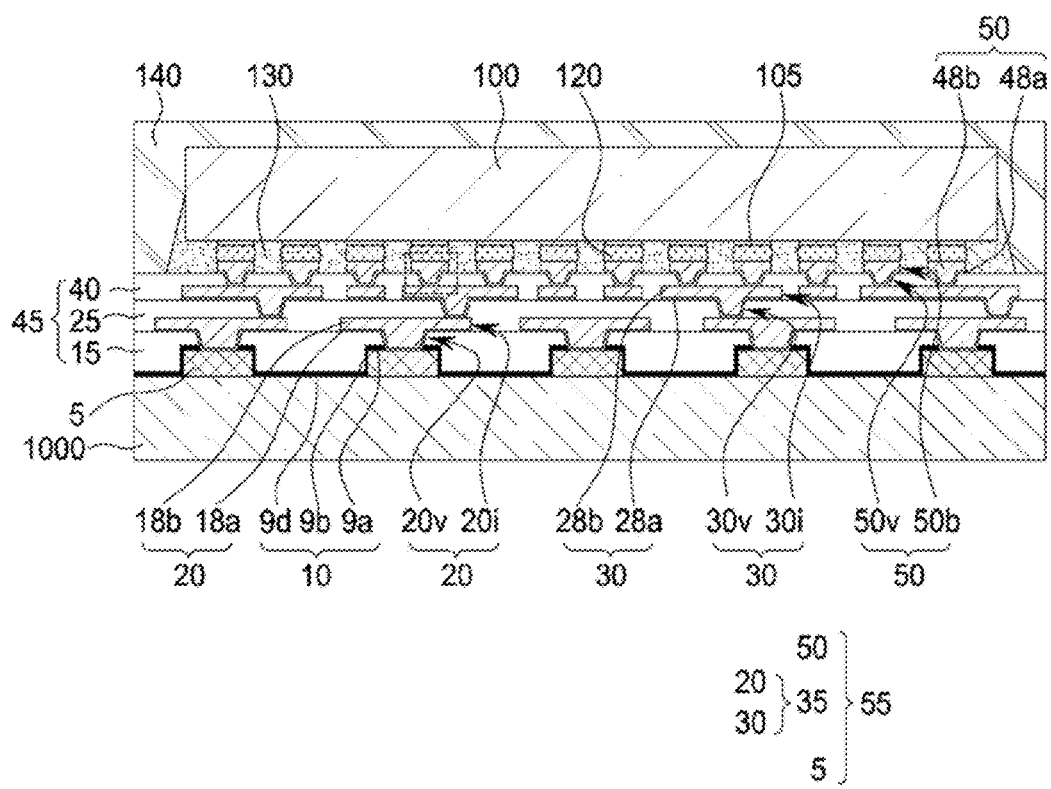

Referring to FIG. 9, the semiconductor chip 100 may be prepared. The semiconductor chip 100 may be any one of the semiconductor chip 100 as in FIG. 1 or the semiconductor chips described in FIGS. 5A to 5E (300a, 300b, 300c in FIG. 5A, and 600 in FIGS. 5C to 5E). Hereinafter, for convenience of description, the semiconductor chip 100 in FIG. 1 will be mainly described.

The semiconductor chip 100 may be mounted on a structure including the insulating structure 45 and the conductive structure 55. For example, the semiconductor chip 100 may include a pad 105, and the pad 105 of the semiconductor chip 100 and the upper conductive pattern 50 may be connected using an upper connection pattern 120. The upper connection pattern 120 may include a solder material. For example, the upper connection pattern 120 bonded to the pad 105 and the upper conductive pattern 50 of the semiconductor chip 100 may be formed using a solder reflow process. An underfill resin 130 surrounding the side surface of the upper connection pattern 120 may be formed between the insulating structure 45 and the semiconductor chip 100. An encapsulant 140 covering at least a side surface of the semiconductor chip 100 may be formed on the insulating structure 45.

Figure 10:
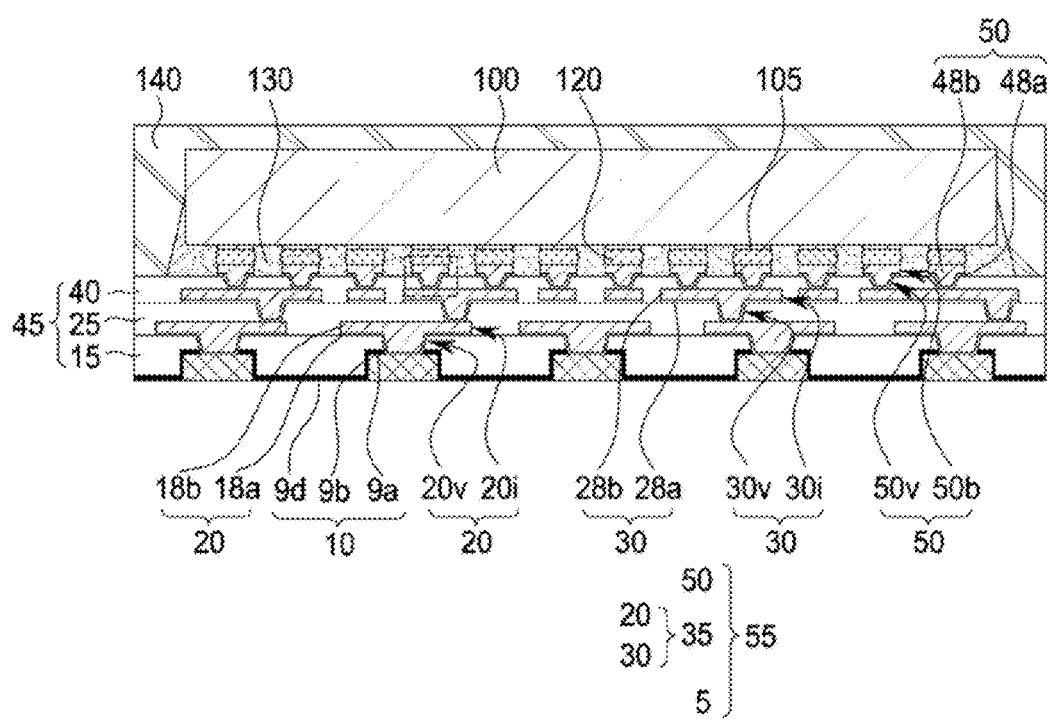

Referring to FIG. 10, the carrier (1000 in FIG. 9) may be removed to expose at least the third portion 9d of the protective layer 10 in contact with the lower surface of the first insulating layer 15, and in addition, to expose the lower surface of the lower conductive pattern 5.

Figure 11:
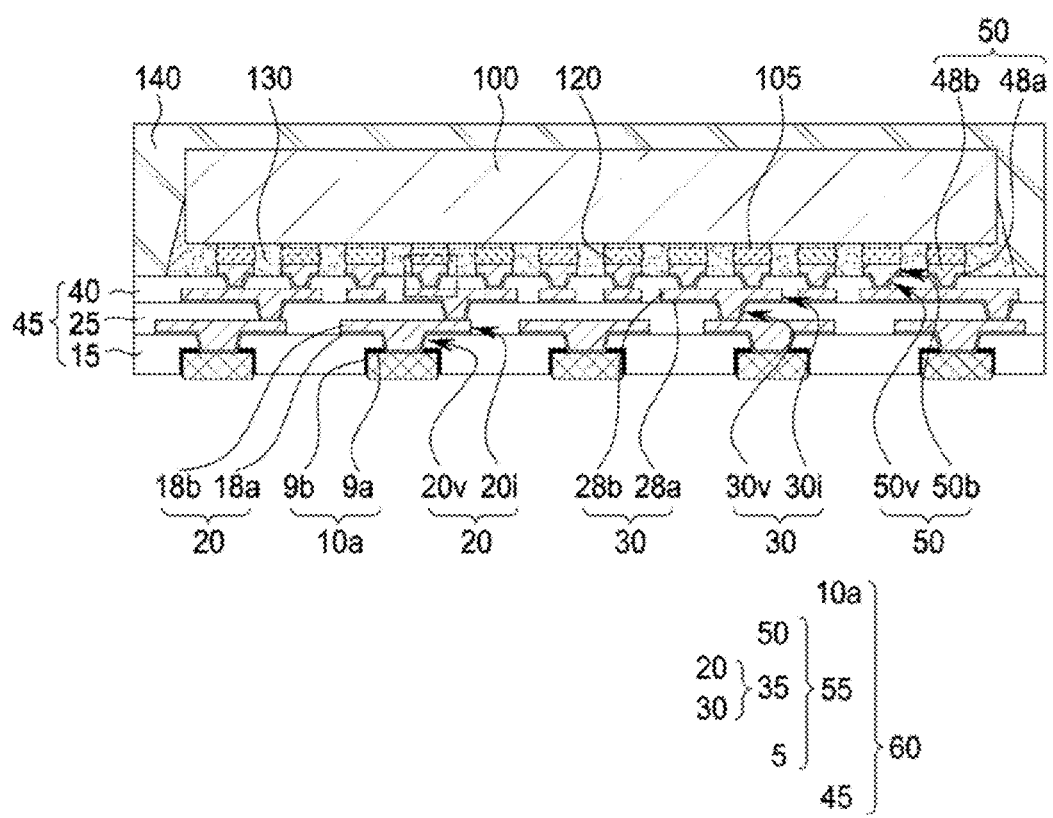

Referring to FIG. 11, the exposed third portion (9d of FIG. 10) of the protective layer (10 of FIG. 10) may be removed by an etching process. Accordingly, the protective layer 10a in contact with the lower conductive pattern 5 may be formed. Accordingly, the same protective layer 10a as that described in FIGS. 1 and 2 may be formed. By removing the exposed portion of the protective layer (10 in FIG. 10) through an etching process, the lower conductive pattern 5 may be formed to have a shape protruding by the thickness of the exposed third portion (9d of FIG. 10) of the protective layer (10 of FIG. 10), from the lower surface of the first insulating layer 15.

Accordingly, the redistribution substrate 60 including the conductive structure 55, the insulating structure 45, and the protective layer 10a may be formed.

In an example, while removing the exposed portion of the protective layer (10 in FIG. 10) by an etching process, the second portion 9b of the protective layer (10 in FIG. 10) in contact with the side surface of the lower conductive pattern 5 may be partially removed. Accordingly, a protective layer (10b in FIG. 3A, 10d in FIG. 3C, 10e in FIG. 3D, 10f in FIG. 3E), the same as that described in FIGS. 3A, 3C, 3D, and 3E, may be formed.

Again, referring to FIG. 1, a lower connection pattern 150 in contact with a lower surface of the lower conductive pattern 5 and a lower end of the protective layer 10a may be formed after the exposed third portion 9d is removed. The lower connection pattern 150 may be formed of a solder ball.

As set forth above, according to example embodiments, a redistribution substrate may include a lower conductive pattern, a redistribution structure on the lower conductive pattern, an insulating structure covering side surfaces of the lower conductive pattern and the redistribution structure, and a protective layer between the lower conductive pattern and the insulating structure. The protective layer may serve to protect the lower conductive pattern by preventing the lower conductive pattern from being peeled off. Accordingly, since the protective layer may prevent defects occurring while the lower conductive pattern is peeled off, reliability of the semiconductor package may be improved.

While example embodiments have been illustrated and described above, it will be apparent to those skilled in the art that modifications and variations could be made without departing from the scope of the present inventive concepts as defined by the appended claims.

What is claimed is:

1. A semiconductor package, comprising:
a redistribution substrate including
a conductive structure having a lower conductive pattern and a redistribution structure electrically connected to the lower conductive pattern,
the redistribution structure being on the lower conductive pattern,
an insulating structure covering at least a side surface of the redistribution structure, and
a protective layer between the lower conductive pattern and the insulating structure;
a semiconductor chip on the redistribution substrate; and
a lower connection pattern below the redistribution substrate and electrically connected to the lower conductive pattern,
wherein the protective layer includes
a first portion in contact with at least a portion of an upper surface of the lower conductive pattern, and
a second portion in contact with at least a portion of a side surface of the lower conductive pattern,
wherein a lower end of the protective layer is located at a level higher than a lower surface of the insulating structure, and
wherein the lower connection pattern is in contact with both the lower end of the protective layer and the lower conductive pattern.

2. The semiconductor package of claim 1, wherein
a thickness of the first portion of the protective layer between the insulating structure and the lower conductive pattern in a first direction is greater than a thickness of the second portion between the insulating structure and the lower conductive pattern in a second direction,
the first direction is perpendicular to the upper surface of the lower conductive pattern, and
the second direction is perpendicular to the side surface of the lower conductive pattern.

3. The semiconductor package of claim 1, wherein the lower end of the protective layer, the lower surface of the insulating structure, and a lower surface of the lower conductive pattern are at different levels.

4. The semiconductor package of claim 1, wherein
a lower surface of the lower conductive pattern is located at a lower level than the lower surface of the insulating structure.

5. The semiconductor package of claim 1, wherein the protective layer includes a conductive material.

6. The semiconductor package of claim 1, wherein
the upper surface of the lower conductive pattern is flat,
the lower conductive pattern includes an upper corner region extending from the upper surface of the lower conductive pattern and being an at least partially curved surface, and
the side surface of the lower conductive pattern extends from the upper corner region.

7. The semiconductor package of claim 1, wherein
the protective layer is a conductive layer,
the redistribution structure includes a redistribution pattern including a redistribution line and a redistribution via,
the redistribution via extends downwardly from a portion of the redistribution line, penetrates through the first portion of the protective layer and contacts the lower conductive pattern, and the redistribution via has a width less than a width of the lower conductive pattern.

8. The semiconductor package of claim 7, wherein
the redistribution pattern includes a seed metal layer and a metal material pattern on the seed metal layer, and
the seed metal layer of the redistribution pattern is in contact with the lower conductive pattern.

9. The semiconductor package of claim 1, further comprising:
an upper connection pattern between the semiconductor chip and the redistribution substrate,
wherein the redistribution substrate further includes an upper conductive pattern on the redistribution structure,
wherein the upper conductive pattern includes
a pad portion located on a level higher than an upper surface of the insulating structure, and
a via portion extending downwardly from at least a portion of the pad portion and electrically connected to the redistribution structure,
wherein the insulating structure covers a side surface of the via portion, and
wherein the upper connection pattern is in contact with the upper conductive pattern.

10. The semiconductor package of claim 9, further comprising an encapsulant covering at least a side surface of the semiconductor chip and surrounding a side surface of the upper connection pattern, the encapsulant being between the semiconductor chip and the redistribution substrate.

11. The semiconductor package of claim 9, further comprising:
an underfill resin surrounding a side surface of the upper connection pattern, between the semiconductor chip and the redistribution substrate; and
an encapsulant covering at least a side surface of the semiconductor chip, the encapsulant being on the redistribution substrate.

12. The semiconductor package of claim 1, further comprising
a plurality of semiconductor chips, the plurality of semiconductor chips including the semiconductor chip,
the plurality of semiconductor chips are spaced apart from each other in a direction, parallel to an upper surface of the insulating structure,
each semiconductor chip of the plurality of semiconductor chips is electrically connected to the redistribution substrate, and
the redistribution substrate further includes a redistribution connection line electrically connecting at least two semiconductor chips of the plurality of semiconductor chips.

13. The semiconductor package of claim 1, further comprising:
a first encapsulant covering at least a side surface of the semiconductor chip, the first encapsulant being on the redistribution substrate;
a vertical connection pattern penetrating through the first encapsulant and electrically connected to a portion of the conductive structure of the redistribution substrate; and
an upper semiconductor chip on the first encapsulant and the semiconductor chip.

14. The semiconductor package of claim 13, further comprising:
an upper redistribution substrate on the first encapsulant, wherein the upper semiconductor chip is on the upper redistribution substrate, the upper redistribution substrate includes an upper redistribution pattern electrically connected to the vertical connection pattern, and
the upper redistribution pattern includes an upper redistribution line, and an upper redistribution via extending downwardly from a portion of the upper redistribution line.

15. A semiconductor package, comprising:
a redistribution substrate having a first surface and a second surface that are opposite surfaces in relation to each other;
a semiconductor chip on the first surface of the redistribution substrate;
a lower connection pattern below the second surface of the redistribution substrate; and
an upper connection pattern electrically connecting the redistribution substrate and the semiconductor chip, the upper connection pattern being between the redistribution substrate and the semiconductor chip,
wherein the redistribution substrate includes
a conductive structure, and
an insulating structure covering at least a side surface of the conductive structure,
wherein the conductive structure includes a lower conductive pattern and a redistribution structure,
wherein the lower conductive pattern is electrically connected to the lower connection pattern,
wherein the redistribution structure includes a plurality of redistribution patterns located at different levels on the lower conductive pattern,
wherein the redistribution substrate further includes a protective layer between the lower conductive pattern and the insulating structure,
wherein the protective layer is a conductive layer,
wherein the protective layer includes
a first portion in contact with at least a portion of an upper surface of the lower conductive pattern, and
a second portion in contact with at least a portion of a side surface of the lower conductive pattern,
wherein a lower redistribution pattern among the plurality of redistribution patterns includes a redistribution line, and a redistribution via extending downwardly from a portion of the redistribution line,
wherein the redistribution via penetrates through the first portion of the protective layer and contacts the lower conductive pattern, and
wherein a side surface of the redistribution via is in contact with the first portion of the protective layer and the insulating structure.

16. The semiconductor package of claim 15, wherein
the conductive structure further includes an upper conductive pattern electrically connected to an upper redistribution pattern among the plurality of redistribution patterns, on the upper redistribution pattern,
the upper connection pattern is in contact with the upper conductive pattern,
the lower connection pattern is in contact with both a lower end of the protective layer and a lower surface of the lower conductive pattern,
in the protective layer, a thickness of the first portion in a first direction is greater than a thickness of the second portion in a second direction,
the first direction is perpendicular to the upper surface of the lower conductive pattern,
the second direction is perpendicular to the side surface of the lower conductive pattern, and the lower end of the protective layer is located at a level higher than a lower surface of the insulating structure.

17. The semiconductor package of claim 16, wherein
the lower conductive pattern includes an upper corner region, which extends from the upper surface of the lower conductive pattern and of which at least a portion is a curved surface, and
the side surface of the lower conductive pattern extends from the upper corner region.

18. A semiconductor package, comprising:
a redistribution substrate including
   a conductive structure having a lower conductive pattern and a redistribution structure on the lower conductive pattern and electrically connected to the lower conductive pattern,
   an insulating structure covering at least a side surface of the redistribution structure, and
   a protective layer between the lower conductive pattern and the insulating structure;
a semiconductor chip on the redistribution substrate; and
a lower connection pattern in contact with both the lower conductive pattern and the protective layer, the lower connection pattern being below the redistribution substrate,
wherein a thickness of the lower conductive pattern is in a range of about 3 μm to about 15 μm,
wherein a width of the lower conductive pattern is in a range of about 80 μm to about 300 μm,
wherein a thickness of the protective layer is in a range of about 30 nm to about 300 nm,
wherein a lower end of the protective layer is located at a level higher than a lower surface of the insulating structure, and
wherein a lower surface of the lower conductive pattern is located at a lower level than the lower surface of the insulating structure.

19. The semiconductor package of claim 18, wherein
the protective layer includes
   a first portion in contact with at least a portion of an upper surface of the lower conductive pattern, and
   a second portion in contact with at least a portion of a side surface of the lower conductive pattern,
in the protective layer, a thickness of the first portion in a first direction is greater than a thickness of the second portion in a second direction,
the first direction is perpendicular to the upper surface of the lower conductive pattern, and
the second direction is perpendicular to the side surface of the lower conductive pattern.

* * * * *